(12) United States Patent
Kim et al.

(10) Patent No.: US 7,768,792 B2
(45) Date of Patent: Aug. 3, 2010

(54) FRONT END MODULE

(75) Inventors: Kyung Joon Kim, Gyeonggi-do (KR);
Hyoung Ki Nam, Gyeonggi-do (KR);
Won Gyu Lee, Gyeonggi-do (KR)

(73) Assignee: LG Innotek Co., Ltd., Seoul (KR)

(*) Notice: Subject to any disclaimer, the term of this patent is extended or adjusted under 35 U.S.C. 154(b) by 790 days.

(21) Appl. No.: 11/518,165

(22) Filed: Sep. 11, 2006

(65) Prior Publication Data

US 2007/0058748 A1 Mar. 15, 2007

(30) Foreign Application Priority Data

| Sep. 12, 2005 | (KR) | ...................... 10-2005-0084895 |
| Sep. 13, 2005 | (KR) | ...................... 10-2005-0084995 |
| Sep. 14, 2005 | (KR) | ...................... 10-2005-0085600 |
| Sep. 14, 2005 | (KR) | ...................... 10-2005-0085955 |
| Sep. 16, 2005 | (KR) | ...................... 10-2005-0086888 |
| Dec. 23, 2005 | (KR) | ...................... 10-2005-0128429 |
| Dec. 26, 2005 | (KR) | ...................... 10-2005-0129850 |
| Dec. 26, 2005 | (KR) | ...................... 10-2005-0129852 |

(51) Int. Cl.
*H05K 7/02* (2006.01)
*H05K 7/06* (2006.01)
*H05K 7/08* (2006.01)
*H05K 7/10* (2006.01)

(52) U.S. Cl. .................. 361/760; 361/763; 361/792

(58) Field of Classification Search ......... 361/760–763, 361/782–784; 333/200–202; 330/280–285
See application file for complete search history.

(56) References Cited

U.S. PATENT DOCUMENTS

| 5,069,522 | A | * | 12/1991 | Block et al. | .................... 385/39 |
| 5,834,994 | A | * | 11/1998 | Shapiro | ...................... 333/202 |
| 6,639,310 | B2 | * | 10/2003 | Takikawa et al. | ............. 257/690 |
| 7,154,336 | B2 | * | 12/2006 | Maeda | ......................... 330/285 |
| 7,515,879 | B2 | * | 4/2009 | Okabe et al. | ................... 455/73 |

FOREIGN PATENT DOCUMENTS

| KR | 2002-0054525 A | 7/2002 |
| KR | 10-2004-0052286 A | 6/2004 |
| KR | 10-2005-0031213 A | 4/2005 |

* cited by examiner

*Primary Examiner*—Tuan T Dinh
(74) *Attorney, Agent, or Firm*—Birch, Stewart, Kolasch & Birch, LLP

(57) ABSTRACT

A front end module includes a multilayered structure. The multilayered structure includes a transmitter, a receiver, and a duplex unit. The multilayered structure further includes a ground layer. The ground layer includes a ground pattern having at least one block on a surface of a substrate of the front end module.

15 Claims, 20 Drawing Sheets

FIG 14
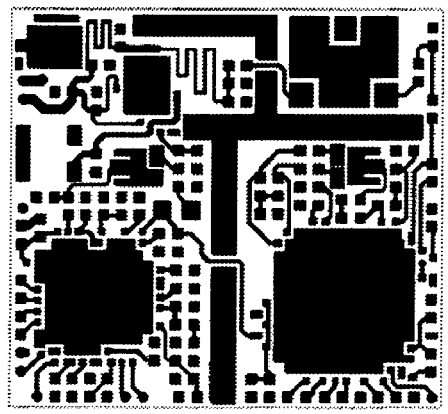
FIG 15
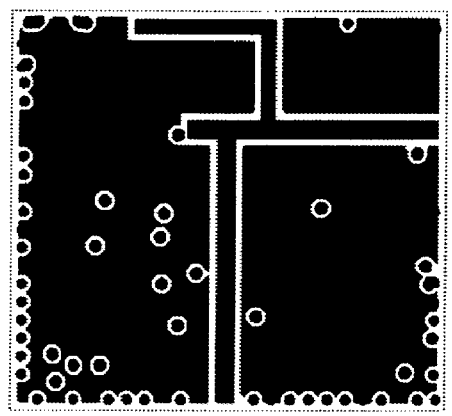
5    FIG 16
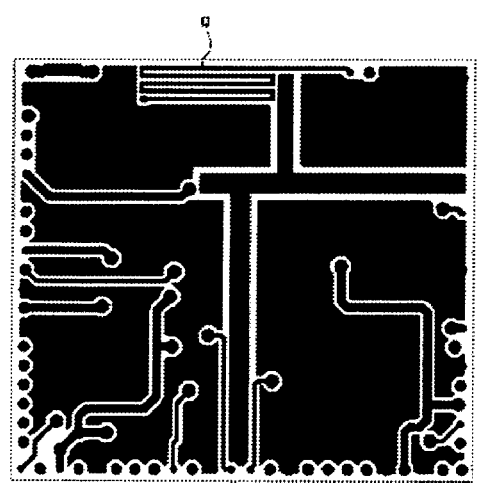

FRONT END MODULE

BACKGROUND OF THE INVENTION

1. Field of the Invention

The present invention relates to a front end module used in a mobile communication device.

2. Description of the Related Art

The front end module (FEM) is a transmitting/receiving device used in a mobile communication device to control an electric wave signal. The FEM is a complex component on which a plurality of electronic components is mounted in a single substrate.

For example, a conventional FEM for processing a code division multiple access (CDMA) will now be described.

FIG. 1 is a circuit block diagram of a conventional CDMA FED.

Referring to FIG. 1, a conventional CDMA FEM includes a duplexer 20, a receiver 30, and a transmitter 40. The transmitter 40 includes a transmitting process module 46 (a Tx BBA or RF transmitter), transmitting filter 44, and a power amplifier module (PAM) 42. The receiver 30 includes a low noise amplifier (LNA) 32, a receiving filter 34, and an receiving process module 36 (Rx BBA or RF receiver).

The duplexer 20 separates receiving and transmitting signals and transmits the same to an antenna 10 or a receiver 30. The receiving process module 36 and a transmitting process module 46 are connected to a base band process unit 50.

The base band process unit 50 generates multimedia data by analyzing a digital signal to control each circuit unit.

The transmitting process module 46 and the receiving process module 36 modulate or demodulate an intermediate frequency signal or a digital signal and perform an analog/digital (A/D) or D/A converting process.

The transmitter filter 44 or the receiver filter 34 filters off a transmitting band frequency signal or a receiving band frequency signal. The PAM 42 and the LNA 32 amplify the transmitted signal so that the transmitted signal can be processed as the transmitting or receiving signal.

The CDMA FEM is generally mounted on a multi-layered structure substrate. The circuit devices are surface-mounted and die-bonded on a top layer and a ground pattern, a wire pattern, and the like are formed on an interlayer. In addition, a ground pattern, a terminal pattern, and the like are formed on a bottom layer. The layers are electrically conducted through a via-hole.

Problems of the convention FEM will now be described hereinafter.

First, the conventional FEM has the following structure problems of the substrate.

Since most of the regions of the substrate are opened, when the FEM is mounted through a surface mounting technology, the FEM may be sided and thus the performance of the FEM varies according to an amount of solder member deposited for the electron conduction.

In addition, the conventional FEM is comprised of a variety of electronic components and a barrier is formed to prevent electric wave interference and disperse heat. A shield formed of metal is provided to correspond to the barrier. However, there is a limitation in preventing the electric wave interference between devices using the barrier.

Furthermore, since the components of the FEM are grouped in many blocks and mounted. Therefore, the mounting, bonding, and molding processes must be independently performed. Therefore, the overall process is complicated and the process treating time increases. In addition, in the conventional CDMA FEM, a chip inductor (not shown) is generally used as an antenna terminal of the duplexer 20. However, the chip inductor is relatively expensive and requires a space for the surface mounting. In addition, the receiving performance may vary according to the change during the surface mounting process.

In addition, since the conventional FEM uses a plurality of electric wave paths using a plurality of receiving components such as receiving chips, it can realize the diversity technology that can increase the number of communication channels. In this case, since the number of the receiving chips and the peripheral components increases, the mounting area of the substrate must be enlarged. This makes it difficult minimize the mobile communication device in which a multi chip module (MCM) is mounted.

Second, the conventional FEM has a variety of problems in the overall operational function.

In the conventional FED, a switching circuit unit (not shown) is connected to the PAM 42 to control the operation of the PAM 42. According to this power supply structure using the switching circuit unit (not shown), since a relatively high intensity of signal is applied, the PAM 42 may be damaged. Furthermore, a noise component is inputted together with electric power, the performance of the PAM 42 may be unstable.

Furthermore, when the circuit devices constituting the conventional FEM are mounted on the substrate, the transmitting and receiving performance may vary. That is, according to the arrangement design of the receiving filter 34, the receiving sensitivity, intermodulation distortion property, single tone desensitization property, and the like may vary. The performance value of the convention FEM is required to be improved.

Furthermore, as the mobile communication device is small-sized and lightweight, the PAM 42 and the duplexer 20 of the conventional FEM are coupled at a complex module. By the complexion of the device modules, the impedance tuning area of the final product is reduced.

That is, the conventional complex module is designed to conform to the efficiency and impedance appropriate for the linearity and the performance of the complex module displays its proper performance only for 50Ω terminal impedance of the antenna. Therefore, when the performance improvement for certain terminal impedance is done by adjusting an impedance of a bonding portion in the device, it is impossible to realize the performance improvement in the convention complex module. In addition, since the PAM 42 has a matching circuit unit inside thereof and another matching circuit unit needs to be provided between the PAM 42 and the duplexer 20, a proper space and additional matching devices are required.

In the conventional CDMA mobile communication device, when the RF signal is converted into an intermediate frequency signal, a reference frequency signal transmitted from a voltage controlled oscillator (VCO) (not shown) is necessary. However, when the VCO is designed in a single module according to the prior art, phase noise may be mixed, thereby deteriorating the performance of the receiving unit.

SUMMARY OF THE INVENTION

Accordingly, the present invention comprises an FEM that substantially obviates one or more problems due to limitations and disadvantages of the related art.

The present invention comprises an FEM that can improve the solderability and grounding efficiency by forming a ground pattern in a plurality of blocks.

The present invention comprises an FEM that can stably perform the communication function by improving a ground pattern structure not having a barrier structure.

The present invention comprises an FEM that can be reduced in a size by forming a receiver, transmitter, duplexer, a GPS unit, and the like on a single block.

The present invention comprises an FEM having a test pattern that extends to an external side to make it possible to check the operation of the completed circuit.

The present invention comprises an FEM that can optimize an RF signal finally outputted by providing a control unit such as a distribution device instead of using a concentration device such as a chip inductor.

The present invention comprises an FEM that can effectively arrange components thereof and can make the size of the MCM product smaller by improving a mounting structure of the components of a diversity receiving unit.

The present invention provides an FEM that can stably supply power even when a variable power state or a noise component input state occurs.

The present invention provides an FEM that can improve the receiving performance by improving the arrangement of a receiving process unit, a duplexer unit, and a receiving filter and integrating an amplifier with the receiving process unit.

The present invention provides an FEM that can simplify a matching circuit unit and lower the impedance for the duplexer unit.

The present invention provides an FEM having a power terminal structure that can effectively remove phase noise components of power from a voltage controlled oscillator circuit.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

The invention, as embodied and broadly described herein, provides a front end module having a multilayered structure including a transmitter, a receiver, and a duplex unit: wherein the multilayered structure comprising a ground layer including a ground pattern having at least one block on a surface of a substrate of the front end module.

In another aspect of the present invention, there is provided a front end module including end module comprising: a transmitter for processing a transmitting signal and a receiver for processing a receiving signal and a duplex unit for separating the transmitting and receiving signals, comprising: a single module having a block of the receiver, a block of the transmitter, and a block of the duplex unit is formed on a multilayered substrate.

In a further another aspect of the present invention, there is provided a front end module including duplex unit for separating and transmitting the receiving and transmitting signals, a receiver for processing a receiving signal and transmitter for processing a transmitting signal and having a power amplifier module having a power input terminal, comprising: a switching circuit unit having a power output terminal connected to the power input terminal to supply the power applied from the power unit to the power amplifier module, thereby controlling the amplifying function of the power amplifier module; and a passive device unit connecting the power input terminal to the power output terminal to stabilize the power voltage.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 14 is a view of another modified example of a pattern of a first layer substrate of the FEM according to the second embodiment of the present invention;

FIG. 15 is a view of another modified example of a pattern of a second layer substrate of the FEM according to the second embodiment of the present invention;

FIG. 16 is a view of another modified example of a pattern of a third layer substrate of the FEM according to the second embodiment of the present invention;

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

First Embodiment

An FEM according to a first embodiment of the present invention will now be briefly described.

Figure 1:
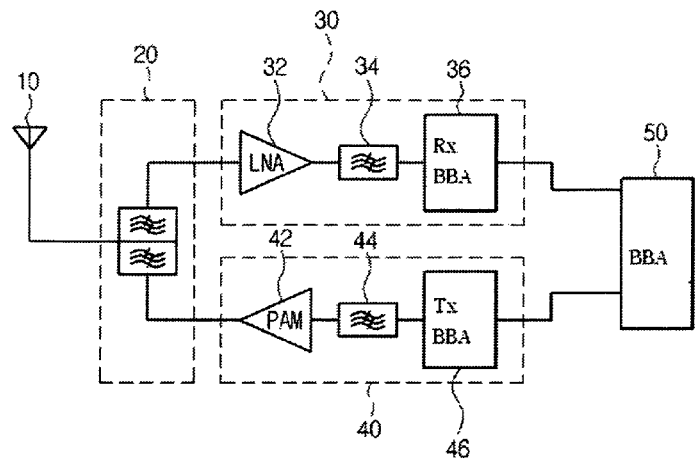
FIG. 1 is a circuit block diagram of a conventional CDMA FED.
Figure 2:
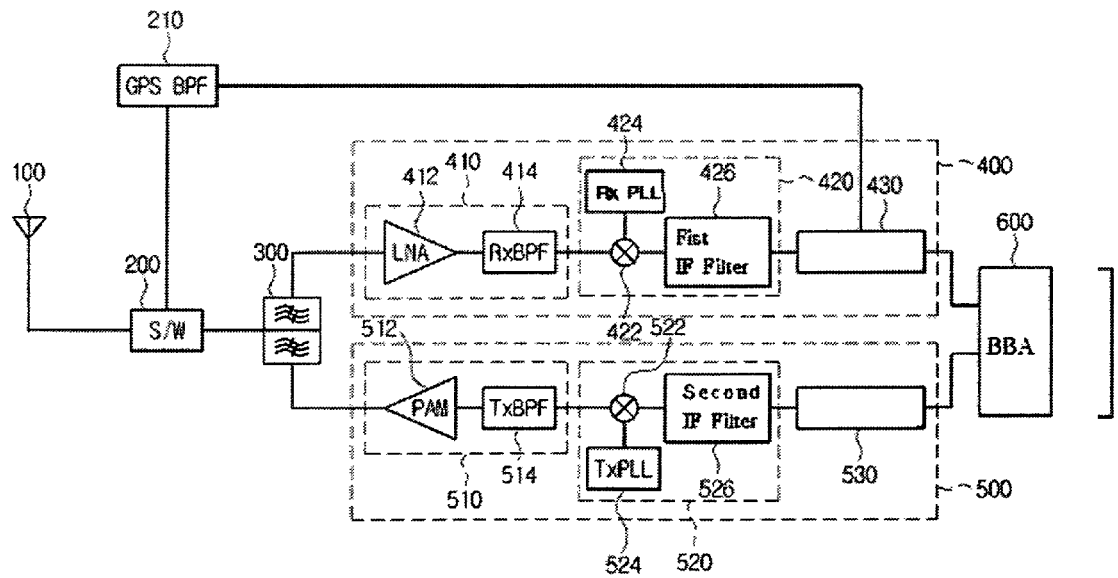
FIG. 2 is a circuit block diagram of an FEM according to a first embodiment of the present invention.

FIG. 2 is a circuit block diagram of an FEM according to a first embodiment of the present invention;

Referring to FIG. 2, an FEM according to a first embodiment of the present invention includes a duplexer 300, a receiver 400 and a transmitter 500. The receiver 400 includes a radio frequency (RF) receiving unit 410 having low noise amplifier (LNA) 412 and a receiving band pass filter (Rx BPF) 414, an intermediate frequency (IF) receiving unit 420 having a first mixer 422 and a first phase locked loop circuit 424 and an First IF Filter 426, and a receiving process unit 430.

The transmitter 500 includes an RF transmitting unit 510 having a PAM 512 and a transmitting band pass filter (Tx BPF) 514, an IF transmitting unit 520 having a second mixer 522 and a second phase locked loop circuit 524 and a second IF filter 526, and a transmitting process unit 530.

The duplexer 300 is connected to an antenna 100 via a switching circuit 200.

The switching circuit 200 is connected to the receiving process unit 430 via a global positioning system (GPS) BPF 210. The receiving process unit 430 and the transmitting process unit 530 are connected a base band process unit 600.

The functions of the components of the FEM will now be described.

The antenna 100 receives a GPS signal and a CDMA signal and transmits the same to the switching circuit 200. The switching circuit 200 separates the GPS signal and the CDMA signal from each other and transmits respectively the GPS and CDMA signals to the GPS BPF 210 and the duplexer 300.

The switching circuit 200 can be formed of, for example, a diplexer or a single pole double throw (SPDT) switch. The diplexer includes a high pass filter (HPF) and a low pass filter (LPF). The diplexer divides the overall signal in which a variety of frequency signals are mixed into two frequency bands whose spectrums are not overlapped using a frequency division multiplexing technology.

The HPF of the diplexer transmits the CDMA signal, which is in a relatively high band among the signals inputted through the antenna 100, to the duplexer 300. The LPF transmits the GPS signal, which is in a relatively low band among the signals inputted from the antenna 100, to the GPS BPF 210.

The SPDT switch can be operated by bias power as a sort of an integrated circuit switch. The SPDT switch is operated up to 3 GHz by two types of direct current (DC) straight polarity control voltages. Since the control voltage is very low, the switch can be turned on and off by the application of a voltage of 2.4V.

The duplexer 300 divides the CDMA signal into a transmitting signal and a receiving signal and transmits the same to the antenna 100 or the receiver 400.

The LNA 412 suppresses noise components to amplify the receiving signal. The receiving BPF 414 filters off signals mixed during the amplifying process to transmit the desired receiving signal.

The first phase locked loop circuit 424 includes a temperature compensated crystal oscillator (TCXO) circuit, a phase locked loop circuit, a VCO circuit. By this constitution, the VCO circuit stably provides a frequency source that can be variable if required.

The first mixer 422 mixes the RF receiving signal transmitted from the receiving BPF 414 with a frequency source signal transmitted from the first phase locked loop circuit 424 to generate a IF receiving signal.

The first IF filter 426 filters off the noise component signal mixed during the mixing process and transmits the filtered signal to the receiving process unit 430.

The receiving process unit (that are generally called "RF BBA" or "RF receiver") 430 includes a demodulator, a LPF (low pass filter), and a D/A converter. The receiving process unit 430 codes and filters the received signal and converts the received signal into a digital signal.

Particularly, the receiving process unit 430 that is formed in a single chip includes an asynchronous GPS that demodulates the GPS signal transmitted from the GPS BPF 210, converts the modulated GPS signal into digital data, and transmits the digital data to the base band process unit 600.

The base band process unit 600 that is called "BBA" or "MSM" includes a central process unit, a CDMA digital modulator, a CDMA digital demodulator, a channel encoder, and a channel decoder. The base band process unit 600 encodes/decodes the CDMA signal, processes the CDMA signal to multimedia data, and controls the input/output unit of a display device and a keypad to provide a user interface.

In addition, when the base band process unit 600 modulates/demodulates the transmitting/receiving signal, the base band process unit 600 detects an intensity of the signal to generate a gain control signal. The base band process unit 600 controls the intensity of the signal by transmitting the gain control signal to the LNA 412 or the PAM 512.

Describing the transmitter 500, the transmitting process unit 530 includes a modulator, a LPF, and an A/D converter. The transmitting control unit 530 decodes and filters a digital signal transmitted from the base band process unit 600 and converts the digital signal into an analog signal.

The second IF filter 526 filters a desired transmitting signal among the analog signal inputted to the transmitting process unit 530. The second mixer 522 mixes the base band signal transmitted from the second IF filter 526 with a frequency source signal transmitted from the second phase locked loop circuit 524, thereby generating an IF transmitting signal.

The second phase locked loop circuit 524 is structured to be similar to the first phase locked loop circuit 424. The second phase locked loop circuit 524 provides a frequency source signal for generating a transmitting band frequency.

The transmitting BPF 514 filters an RF signal from the received signal and the PAM 512 amplifies the filtered signal to a level that can be transmitted through the antenna 100.

Figure 3:
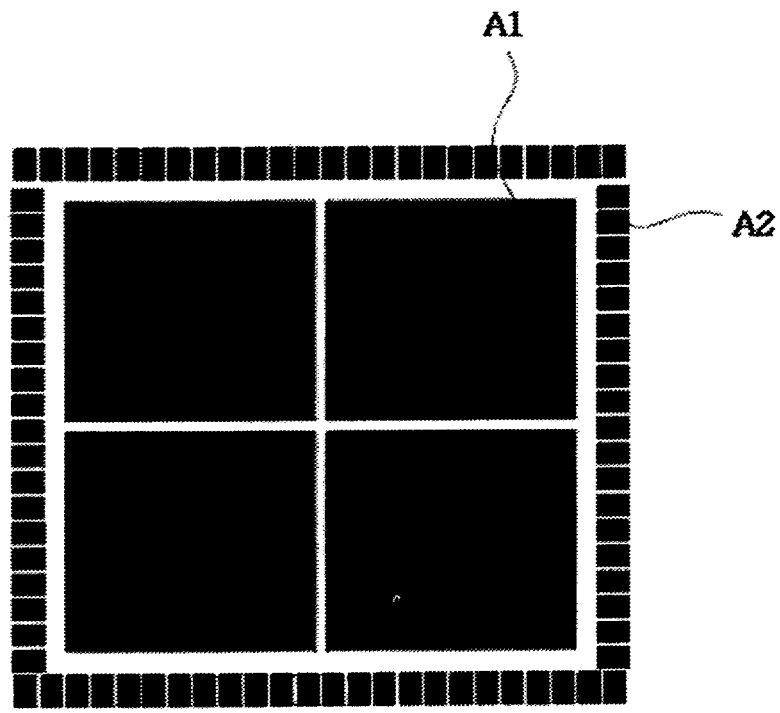
FIG. 3 is a view illustrating an example of a ground layer of a substrate of the FEM according to the first embodiment of the present invention.

In FIG. 3, a ground layer of the FEM is exampled. The ground layer is the bottom layer.

The surface of the bottom layer is opened in a plurality of blocks to have ground pattern A1 that is formed on the surface of the bottom layer. The blocks of the ground pattern A1 are separated from each other by a line region that is not opened.

In addition, terminal pattern A2 comprises a plurality of terminals around the ground pattern, i.e., along a periphery of the bottom layer.

In the first embodiment of the present invention, the ground pattern A1 is formed in a rectangular lattice structure. The ground pattern A1 has four blocks. That is, the ground pattern A1 has two rows and two columns.

Figure 4:
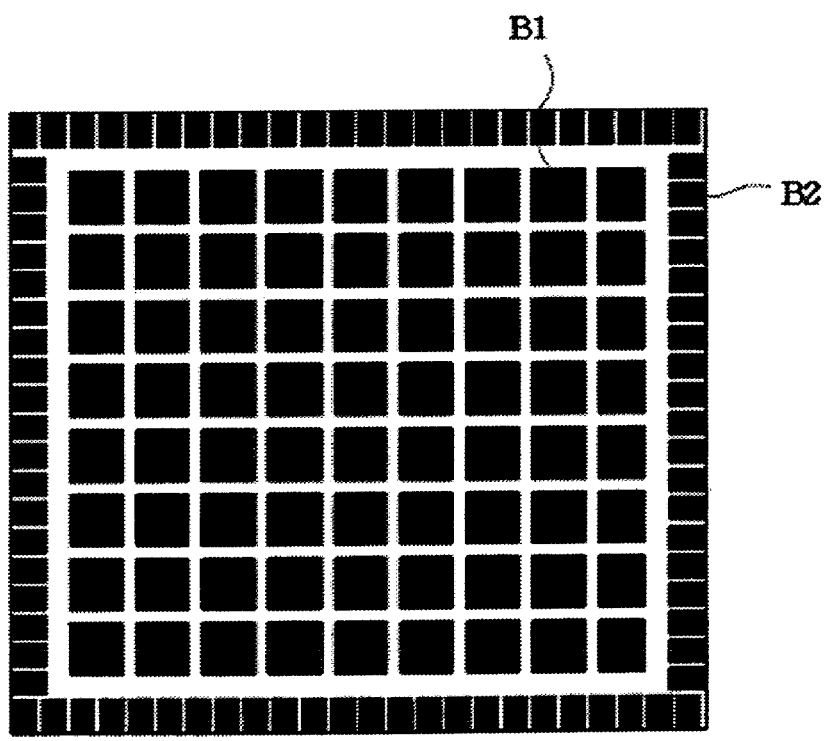
FIG. 4 is a view illustrating a modified example of a ground layer of a substrate of the FEM according to the first embodiment of the present invention.

Referring to FIG. 4, another example of a ground layer of the substrate of the FEM according to the first embodiment is illustrated. This ground layer is also bottom layer.

In the first embodiment of the present invention, The surface of the bottom layer is opened in a plurality of blocks to have ground pattern B1 that is formed on the surface of the bottom layer. The blocks of the ground pattern B1 are separated from each other by a line region that is not opened.

In addition, terminal pattern B2 comprises a plurality of terminals around the ground patterns, i.e., along a periphery of the bottom layer. The ground pattern B1 is formed in a rectangular lattice structure having 72 blocks arranged in 9 rows and 8 columns.

Comparing the ground pattern of FIG. 3 with the ground pattern of FIG. 4, the solderability of the ground pattern of FIG. 3 is lower than that of the ground pattern of FIG. 4. However, since the ground pattern region defining a unit block of the ground pattern of FIG. 3 is wide, the grounding efficiency of the ground pattern of FIG. 3 is better than that of the ground pattern of FIG. 4.

The ground pattern of FIG. 4 has a lower grounding efficiency compared with the ground pattern of FIG. 3. However, since an area of B1 can similarly maintain that of B2, the solder ability of the ground pattern of FIG. 3 is lower than that of the ground pattern of FIG. 4.

However, the solderability and ground efficiency of both of the ground patterns of FIGS. 3 and 4 are better than those of the conventional ground pattern.

Therefore, the ground pattern can be formed in a variety of structures according to a type of a mobile communication device, a type of a frequency channel, a device arrangement design, and a type of a ground layer.

According to the FEM according to the first embodiment of the present invention, since the ground pattern such as the number of blocks and arrangement can be formed in a variety of structures according to a type of a mobile communication device, a type of a frequency channel, a device arrangement design, and a type of a ground layer, the optimum solderability and grounding efficiency can be simultaneously realized.

Second Embodiment

Figure 5:
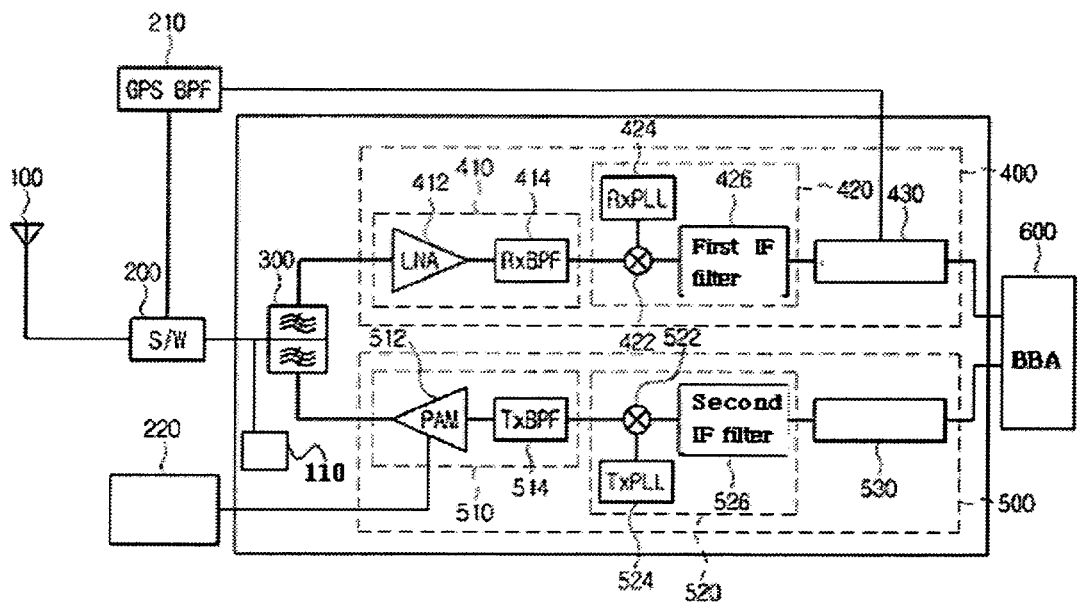
FIG. 5 is a circuit block diagram of an FEM according to a Second embodiment of the present invention.

FIG. 5 is a circuit block diagram of an FEM according to a Second embodiment of the present invention;

Referring to FIG. 5, an FEM according to a first embodiment of the present invention includes a duplexer 300, a receiver 400 and a transmitter 500. The FEM of the second embodiment is similar to that of the first embodiment.

Comparing a first embodiment of the present invention, the second embodiment of the present invention comprises further an inductor 110 that is connected to an antenna terminal of the duplexer 300 and a load switch 220 that is connected to the PAM 512, Referring to FIG. 5, the load switch 220 functions to turn on and off the amplifier of the PAM 512.

The load switch 220 may be provided as a separated switch device or as a switching circuit having a resistor, a switching transistor, a capacitor, and a diode.

The load switch 220 receives a control signal of the base band process unit 600 and turns on and off a main power of the PAM 512 of the transmitter 500 by control signal.

That is, the base band process unit 600 allows the PAM 512 to operate by control signal in a step where the transmitting signal is amplified and transmitted through the transmitting unit.

The functions of the components of the FEM according to the second embodiment are similar to those of the components of the FEM according to the first embodiment.

Figure 6:
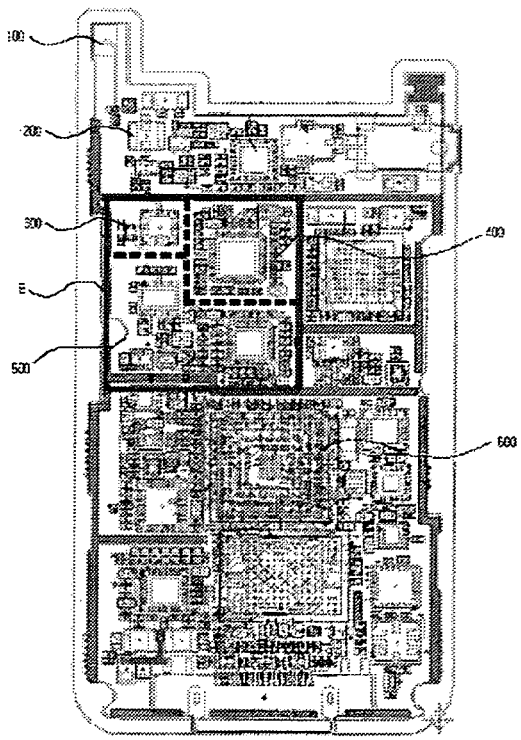
FIG. 6 is a top view of an example of the mounting of components of the FEM according to the second embodiment on a substrate.

FIG. 6 is a top view of an example of the mounting of the components of the FEM according to the second embodiment on a substrate.

Referring to FIG. 6, the FEM according to the second embodiment of the present invention is mounted on a substrate. An antenna is mounted on an uppermost protruding portion of the substrate and a switching circuit 200 is mounted under the protruding portion, thereby forming a block.

The receiver 400, transmitter 500, and duplexer 300 are mounted on the lower portion of the block of the switching circuit 200. Digital chips, passive devices, bonding portions and transmission patterns that form circuits of the receiver 400, transmitter 500, and duplexer 300 are molded on the substrate. Therefore, they can be realized and operated as an independent FED.

Figure 7:
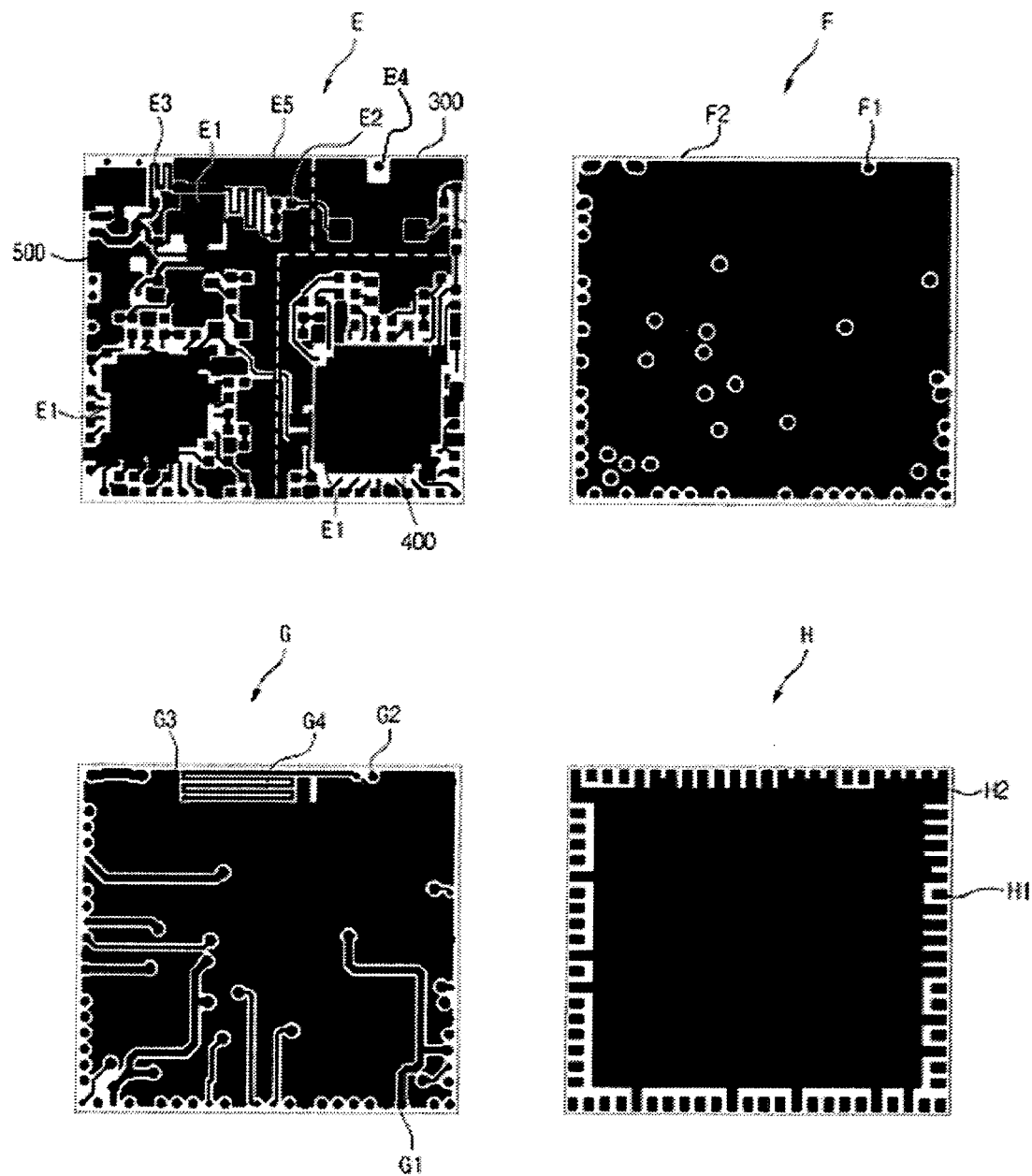
FIG. 7 is a top view illustrating a substrate structure of the FEM according to the second embodiment of the present invention.

FIG. 7 is a top view illustrating a substrate structure of the FEM according to the second embodiment of the present invention.

FIG. 7 shows a substrate on which the receiver 400, transmitter 500, and duplexer 300 are mounted. The substrate has a multilayered structure.

The substrate according to the second embodiment of the present invention includes a device mounting layer E, an upper ground layer F, a wire pattern layer G, and a lower ground layer H. On the device mounting layer E, a die bonding pattern E1 on which devices of the transmitter 500, receiver 300 and duplexer 300 are mounted, a terminal pattern E2 for the devices, a transmitting pattern E3, and a via-hole pattern E4 are formed.

At this point, unlike the conventional structure on which a barrier is simply formed on a line, on the substrate according to the second embodiment, a ground pattern E5 is formed on at least a part of region other than the region of the patterns E1, E2, E3, and E4 and spaced apart from the pattern regions.

The upper ground layer F positioned under the device mounting layer E is provided with a plurality of via-holes F1 for electrically conducting the device mounting layer E, wire pattern layer G and the lower ground layer H. The upper ground layer F is further provided with a ground pattern F2 separated from the via-holes F1.

The wire pattern layer G disposed under the upper ground layer F is provided with a transmitting pattern G1 for electrically interconnecting the devices mounted on the device mounting layer E. A via-hole G2 is formed on an end of the wire pattern layer G and a ground pattern G3 separated from a transmitting pattern G1 and the via-hole G2 and a micro strip line G4 is formed on the rest region of the wire pattern layer G. The micro strip line G4 twisted by several times is formed in a strip line pattern.

A connecting pattern H1 such as a surface mounting technology (SMT) pattern is formed on a periphery portion of the lower ground layer H. A ground pattern H2 separated from the connecting pattern H1 is formed on the rest portion.

Figure 8:
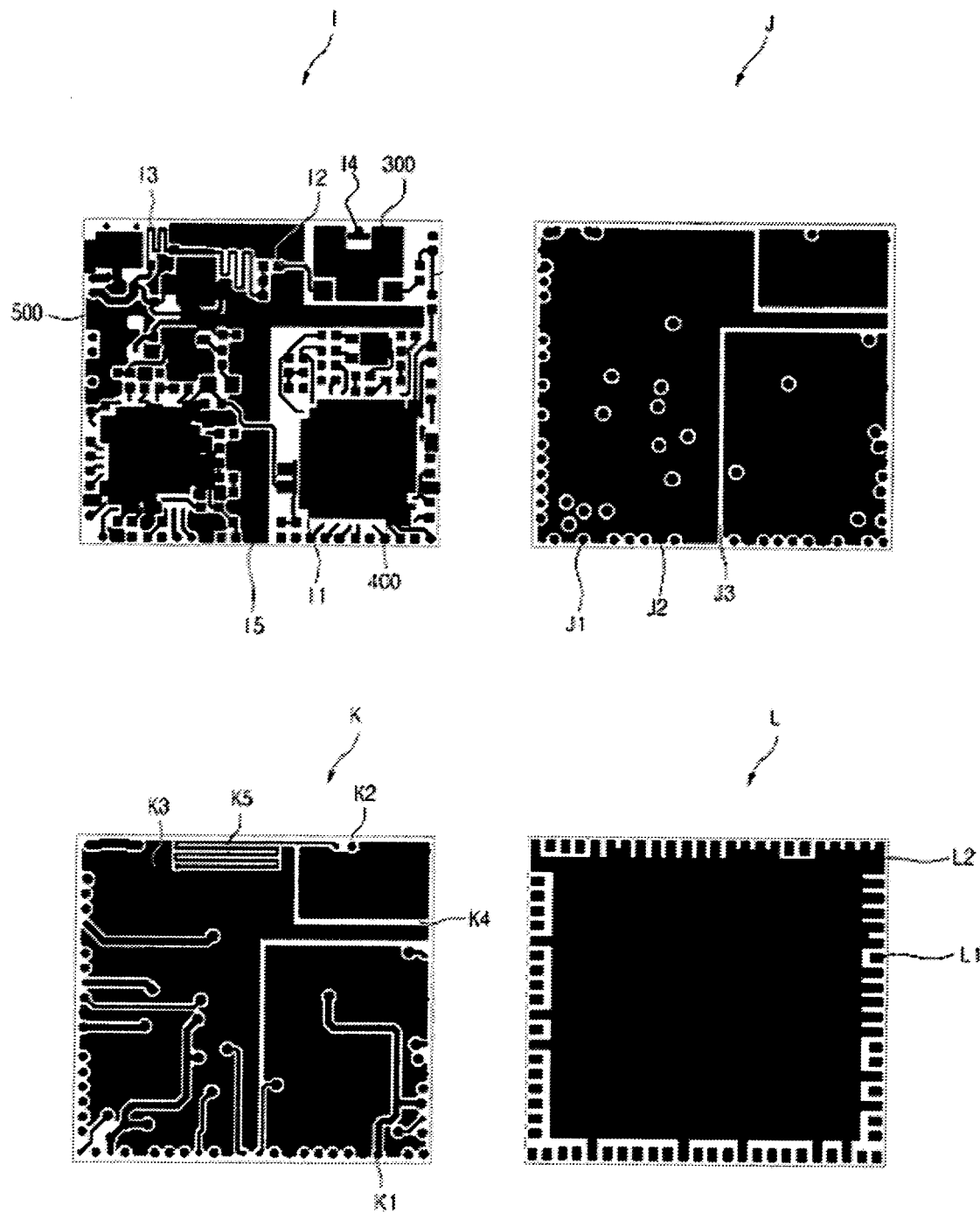
FIG. 8 is a top view of a modified example of the substrate structure of the FEM according to the second embodiment of the present invention.

FIG. 8 is a top view of a modified example of the substrate structure of the FEM according to the second embodiment of the present invention.

FIG. 8 shows an example where the transmitter 500, receiver 400 and duplexer 300 that constitute a single module are mounted on the substrate having a multilayered structure.

The substrate according to this modified example includes a device mounting layer I, an upper ground layer J, a wire pattern layer K, and a lower ground layer L. On the device mounting layer J, a die bonding pattern I1 on which devices of the transmitter 500, receiver 400 and duplexer 300 are mounted, a terminal pattern I2 for the devices, a transmitting pattern I3, and a via-hole pattern I4 are formed.

The description of the same structure as the substrate structure shown in FIG. 7 will be omitted herein.

On the transmitter mounting region of the device mounting layer I, a ground pattern I5 is formed on at least a part of region other than the region of the patterns I1, I2, I3, and I4. On the receiver and duplexer mounting region, no ground pattern is formed on the rest region other than the region of the patterns I1, I2, I3, and I4.

The upper ground layer J disposed under the device mounting layer I is provided with a plurality of via-holes J1 and a ground pattern J2 formed on the rest region and separated from the via-holes J1. A pattern open region J3 is formed in a line shape corresponding to a boundary portion between the receiver mounting region and the duplexer mounting region.

The wire pattern layer K disposed under the upper ground layer J is provided with a transmitting pattern K1. A via-hole K2 is formed on an end of the wire pattern layer K and a ground pattern K3 separated from a transmitting pattern K1 and the via-hole K2 and a micro strip line K5 is formed on the rest region of the wire pattern layer K. The micro strip line K5 twisted by several times is formed in a strip line pattern.

In addition, like the upper ground layer J, on the wire pattern layer K, a pattern open region K4 is formed in a line shape corresponding to the pattern open region J3

A connecting pattern L1 such as a surface mounting technology (SMT) pattern is formed on a periphery portion of the lower ground layer L. A ground pattern L2 separated from the connecting pattern L2 is formed on the rest portion.

The performance of the FEDs having the substrate structures of FIGS. 7 and 8 will be now compared with that of the conventional FED.

Figure 9:
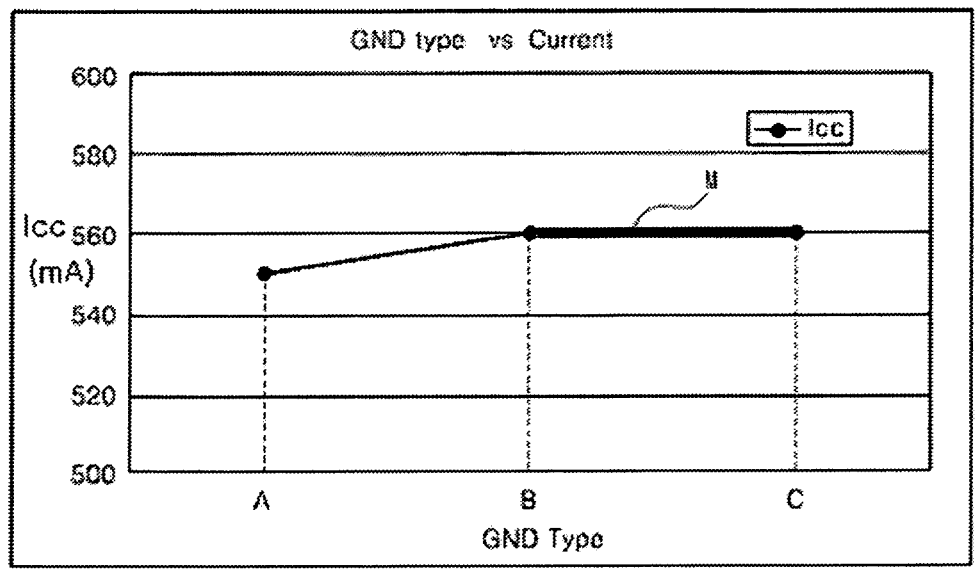
FIG. 9 is a graph illustrating current flow properties of the FEDs having the substrate structures of FIGS. 7 and 8 and the conventional FED.
Figure 10:
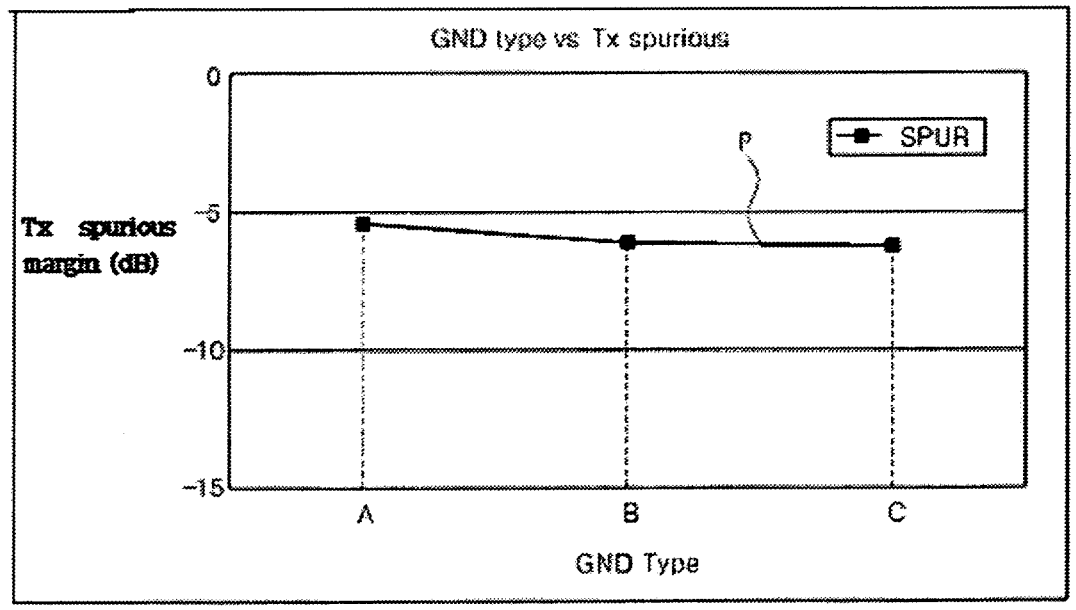
FIG. 10 is a graph illustrating spurious response properties of the FEDs having the substrate structures of FIGS. 7 and 8 and the conventional FED.
Figure 11:
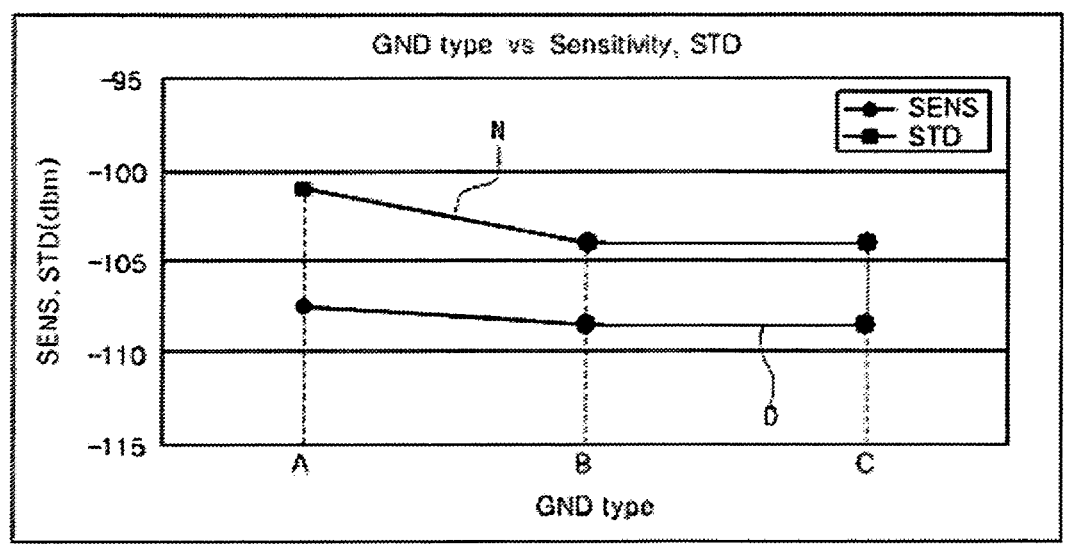
FIG. 11 is a graph illustrating receiving sensitivity properties of the FEDs having the substrate structures of FIGS. 7 and 8 and the conventional FED.

FIG. 9 is a graph illustrating current flow properties of the FEDs having the substrate structures of FIGS. 7 and 8 and the conventional FED, FIG. 10 is a graph illustrating spurious response properties of the FEDs having the substrate structures of FIGS. 7 and 8 and the conventional FED, and FIG. 11 is a graph illustrating receiving sensitivity properties of the FEDs having the substrate structures of FIGS. 7 and 8 and the conventional FED.

Generally, items for testing the performance of the FEM include a current property, receiving sensitivity, a single tone desensitization property, and spurious property. The spurious property is a value obtained by measuring an amount of frequency components other than a desired frequency band. The transmission of the undesired frequency is called a spurious radiation and the receiving of the undesired frequency is called a spurious response. The lower the receiving sensitivity, the better the performance of the FED.

The desired frequency band is determined by a tolerance of an occupation frequency band width (containing 99.5% of total radiation energy). The undesired frequency includes harmonic components, subharmonic components, parasitic wave components, and modulation components.

In addition, the STD is a value obtained by measuring band signal receiving ability from the corresponding channel when a single tone is existed at a predetermined location from a central frequency of an assigned channel.

Referring to FIGS. 9, 10 and 11, for the current property M representing the performance of the transmitter, the substrates B and C shown in FIGS. 7 and 8 is higher than that of the conventional substrate A.

However, for the spurious property P representing the transmitter performance, the receiving sensitivity D representing the receiver, and the STD N, the substrates B and C shown in FIGS. 7 and 8 is lower than that of the conventional substrate A.

Figure 12:
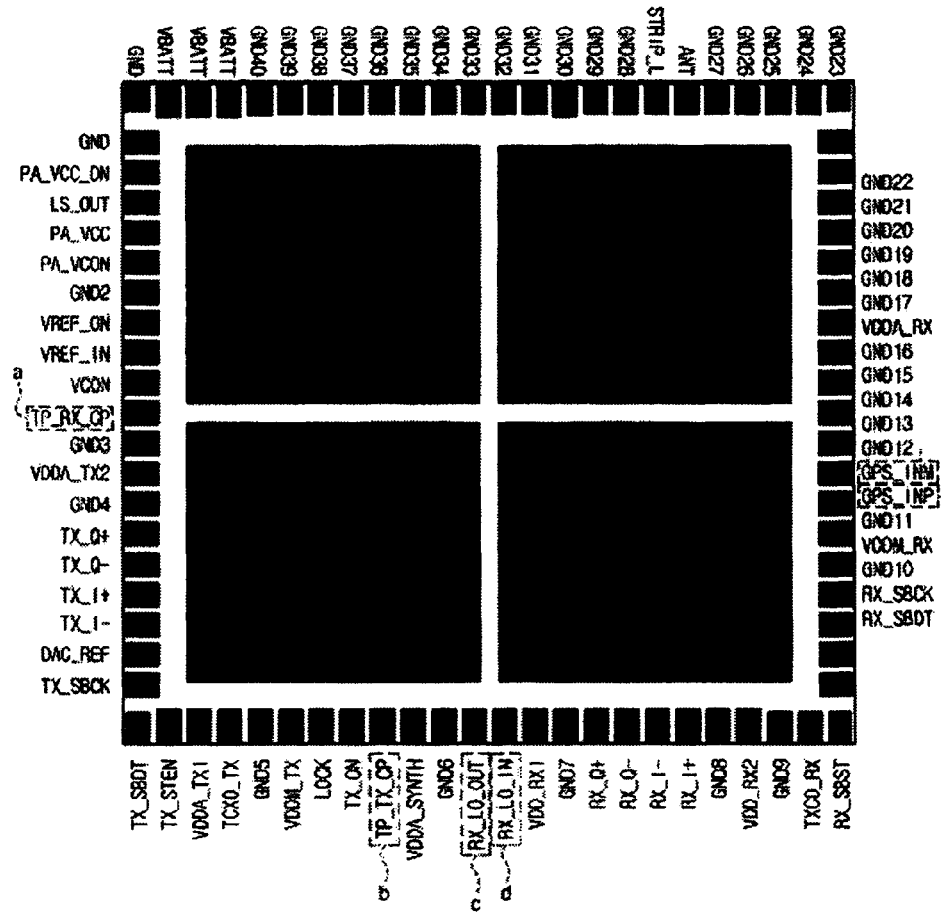
FIG. 12 is a view of an example of a test pattern formed on the lower ground layer of the substrate of the FEM according to the second embodiment of the present invention.

A test pattern may be formed on the lower ground layer of the substrate of the FEM according to the second embodiment of the present invention. FIG. 12 is a view of an example of a test pattern formed on the lower ground layer of the substrate of the FEM according to the second embodiment of the present invention.

Referring to FIG. 12, the wire line pattern connected to the IF receiving unit 420 is connected to a test pattern "TP_Rx_CP" (a) and the wire line connected to the IF transmitting unit 520 is connected to a test pattern "TP_Tx_CP" (b) and the transmitter 500, the receiver 400 and the duplexer 300 are molded to form a single module. Even in this case, it can be observed from an external side if the signal is normally processed.

In addition, since the wire line between the first phase loop unit (i.e., the VCO of the first phase loop) 424 and the first mixer 422 extends around the test pattern "Rx_Lo_OUT"(c) and "Rx_Lo_IN"(d) shown in FIG. 12, it can be observed from the external side if the accurate frequency source is not flowed and is supplied to the first mixer 422.

Figure 13:
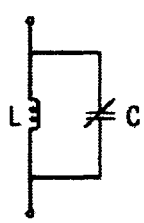
FIG. 13 is a circuit diagram illustrating an equivalent circuit of the inductor provided on the antenna terminal of the duplexer 300 of the FEM according to the second embodiment of the present invention.

FIG. 13 is a circuit diagram illustrating an equivalent circuit of the inductor provided on the antenna terminal of the duplexer 300 of the FEM according to the second embodiment of the present invention.

As shown in FIG. 5, the inductor 110 provided on the antenna terminal of the duplexer 300 matches the duplexer and removes the electro-static discharge components transmitted from an inside or outside of the circuit.

Referring again to FIGS. 7 and 8, it can be seen that the inductor is formed in the form of micro strip lines G4 and K5 on the wire pattern layer. This will be circuit-analyzed with reference to FIG. 13.

Referring to FIG. 13, the equivalent circuit of the micro strip lines G4 and K5 includes an inductor L and a capacitor C. The components of the inductor L means coil components determined by the twist of the coils. The capacitor C means parasitic components.

The total impedance of the equivalent circuit can be represented as "$1/Z_o = 1/L + 1/C$", and since L is $j\omega L$ and C is $1/j\omega C$, $1/Z_o$ can be $1/j\omega L + j\omega C$. That is, $1/Z_o$ can be $(\omega C - 1/\omega L)j$.

A value of the parasitic capacitor is almost "0," and the value of the inductance is operated as an inverse number. The total impedance value is not almost affected by the parasitic capacitance. Therefore, the micro strip line has a more stable impedance value compared with the conventional chip inductor. That is, when the inductor is formed in the form of the micro strip line instead of the chip inductor, the more stable antenna receiving performance can be obtained.

In the substrate structure of the FEM according to the second embodiment of the present invention, since the pattern structure is improved in its isolation, the current property, the spurious property, the STD property, the receiving sensitivity can be improved and the performances of the receiver and the transmitter can be more stably maintained.

Furthermore, since the inductor is mounted in the form of the wire line pattern in the interlayer, the size of the product can be more reduced and the stable antenna receiving performance can be realized. Since the test pattern is formed together with the ground pattern, the defectiveness of the circuits can be effectively determined during the product manufacturing process.

FIGS. 14 through 16 are views of another modified examples of the substrate of the FEM according to the second embodiment of the present invention. Also FIGS. 14 through 16 can be applicable to the substrate of the FEM according to the first embodiment of the present invention.

FIG. 14 is a view of an example of a pattern of a first layer substrate of the FEM according to the second embodiment of the present invention. On the first layer substrate, a die bonding pattern on which circuit devices are mounted, a transmitting pattern, a terminal pattern, and a via-hole are formed.

FIG. 15 is a view of an example of a pattern of a second layer substrate of the FEM according to the second embodiment of the present invention. On the second layer substrate, a die bonding pattern, a via-hole for electrically interconnecting the fist, third and fourth layer substrates, and a barrier pattern are formed.

FIG. 16 is a view of an example of a pattern of a third layer substrate of the FEM according to the second embodiment of the present invention. On the third layer substrate, a transmitting pattern, a die bonding pattern, a barrier pattern, and a micro strip line(g) twisted by several times are formed. An end of the micro strip line (g) is electrically connected to the first layer substrate through the via-hole that is connected to the antenna terminal of the duplexer 310

According to the modified examples of the second embodiment of the present invention, the following effects can be expected.

First, since the devices that are formed in different blocks in the prior art are formed in a single block as a single module, the size of the product can be minimized. Since the functions of the RF, IF, and RF BBA are integrated, it becomes possible to produce a signal module product having many functions.

Second, since the internal operation of the single module FEM can be easily checked using the test pattern, the defectiveness of the product can be quickly identified. As a result, the process time can be reduced.

Third, since the distribution circuit for stabilizing the antenna signal and the switching circuit for selectively operating the power amplifying unit are integrally mounted in the multilayered substrate, the post-process for the antenna terminal can be omitted and the operation of the power amplifier can be stably maintained.

Third Embodiment

A FEM according to a third embodiment of the present invention will now be described. The FEM according to the third embodiment of the present invention is a communication module having a diversity receiving unit, which is mounted in a mobile communication device and process the communication using CDMA 1xEV-DO standard.

Figure 17:
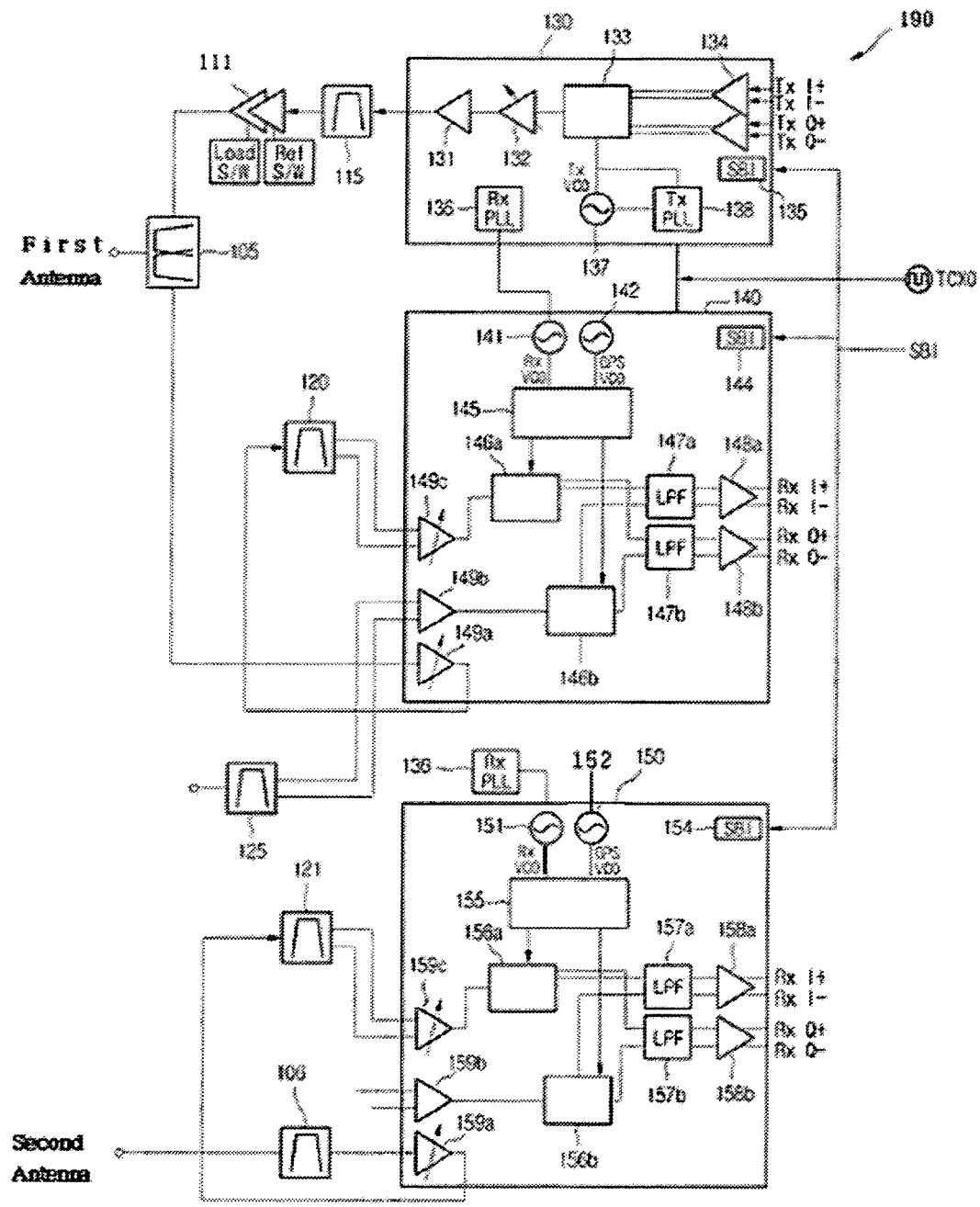
FIG. 17 is a schematic block diagram of an FEM according to a third embodiment of the present invention.

FIG. 17 is a schematic block diagram of an FEM according to a first embodiment of the present invention.

Referring to FIG. 17, a FEM 190 according to a third embodiment of the present invention includes a duplexer 105, a PAM 111, a transmitting filter 115, a transmitting process unit 130, a first receiving filter 120, a second receiving filter 121, a first receiving process unit 140, a second receiving process unit 150, and a GPS filter 125. These components are manufactured as separated components and mounted in the form of MCM.

The MCM mounting structure will be described later with reference to FIG. 18.

The duplexer 105 is a major passing component disposed on an initial terminal of the antenna and functions to filter selectively the frequency both of the transmitting/receiving bands. The duplexer 105 can transmits/receives the transmitting/receiving signal through the signal antenna without any mutual interference.

In order to realize the diversity function, two (first and second) antennas (not shown) are provided. The first antenna is connected to the duplexer 105 and the second antennal is connected to an Rx BPF 106 of the second receiving process unit 150 side.

The PAM 111 includes a power amplifier, a driving amplifier, and a matching circuit to amplify the power so that the transmission/receiving can be realized through the antenna. The transmitting filter 115 filters of undesired frequency components that are mixed during the process of the transmitting signal through the transmitting process unit 130.

The transmitting process unit 130 includes a driving amplifier 131, a gain control amplifier 132, a mixer 133, an amplifier 134, SBI 135, Rx PLL (phase locked loop) 136, Tx VCO 137, Tx PLL 138.

The gain control amplifier 132 controls signal gain using a control signal of a control unit (not shown) to amplify a signal of a transmission band other than the noise components. The driving amplifier 131 amplifies the transmitting signal to a predetermined intensity as an intermediate step before the signal is amplified to final power intensity.

The mixer 133 generates a transmitting frequency signal using an oscillating frequency from the Tx VCO 137 and the Tx PLL 138 applies a control voltage so that the Tx VCO 137 is not moved but provides a stable oscillating frequency. That is, the mixer 133 synchronizes the phase of the oscillating frequency to an accurate frequency band.

The amplifier 134 receives four analog signals, i.e., an I+transmitting signal (a transmitting signal in an In-Phase region, which is transited to a positive phase angle), an I-transmitting signal (a transmitting signal in an In-Phase region, which is transited to a negative phase angle), a Q+ transmitting signal (a transmitting signal in a Quadrature-Phase region, which is transited to a positive phase angle), and a Q- transmitting signal (a transmitting signal in a Quadrature-Phase region, which is transited to a negative phase angle) and amplifies the four signal to an intensity that can be synthesized to an intermediate frequency signal.

The SBI 135 is a circuit controlling the data communication through a series bus line. The Rx PLL 136 is disposed on the transmitting process unit 130 and applies a control voltage to the Rx VCO 141 disposed on the receiving process unit 140.

Meanwhile, the first receiving filter 120 and the first receiving process unit 140 are identical in a constitution and operation to the second receiving filter 121 and the second receiving process unit 150. For the descriptive convenience, the reference numbers will be referred together in the following description.

In order to realize the diversity receiving unit function, the FEM according to the third embodiment of the present invention comprises the receiving filter 120, 121 and the receiving process unit 140, 150. The first and second receiving process units 140, 150 are vertically die-stacked and mounted. This will be described later in more detail with reference to FIG. 21.

The receiving filter 120 of the first receiving process unit 140 filters the amplified signal by the LNA 149a and transmits the filtered signal to the first receiving process unit 140. The LNA 149a amplifies a signal of the CDMA receiving band among the signals separated from the transmitting signal by the duplexer. The receiving filter 121 of the second receiving process unit 150 filters the amplified signal by the LNA 159a and transmits the amplified signal to the second receiving process unit 150. The LNA 159a amplifies a signal transmitted through second antenna.

In the third embodiment of the present invention, the transmitting filters 115 and receiving filters 120, 121 are preferably formed of SAW filters.

The RX VCOs 141 and 151 and GPS VCOs 142 and 152 receive a control voltage from the Rx PLL 136 to generate the oscillating frequency and transmit the oscillating frequency to an oscillating signal divider 145, 155. The oscillating signal divider 145 and 155 transmit the oscillating frequency to the mixer 146a and 156a for the receiving signal and the mixer 146b and 156b for the GPS.

The mixers 146a and 156a for the receiving signal and the mixers 146b and 156b for the GPS generate base band signals using the oscillating frequency. The LPFs 147a and 157a for the receiving signal and the LPFs 147b and 157b for the GPS remove the signal of the DC noise components inputted from the mixers 146a, 156a, 146b, and 156b and filter the base band signal and the GPS signal.

The amplifiers 148a and 158a for the receiving signal and the amplifiers 148b and 158b for the GPS amplify the base band signal and GPS signal to intensities that can be converted into digital signal using a converter.

The SBIs 144 and 154 control the data communication through the series bus line to receive the control signal from the control unit.

The LNAs 149a and 159a for the receiving signal suppress the noise components of the signal separated through the duplexer or the Rx BPF 106 to amplify only the signal of the receiving band to a predetermined intensity. The filter amplifiers 149c and 159c further amplify the receiving signal passing through the receiving filters 120 and 121 so that the signal can be processed in the receiving process units 140 and 150.

Although it is not shown in FIG. 17, a GPS signal antenna is additionally provided on the mobile communication device. And a multiband antenna is provided to receive the signal. Only the GPS band signal can be filtered by using the GPS BPF 125.

The GPS signal filtered by the GPS BPF 125 is amplified by initial terminal amplifiers 149b and 159b for the GPS and transmitted to the mixers 146b and 156b for the GPS.

Generally, since the GPS signal less requires the diversity receiving function compared with the CDMA, as shown in FIG. 17, the GPS signal is processed by the initial amplifier 149b for the GPS, the mixer 146b for the GPS, the LPF 147b for the GPS, and the power amplifier 148b for the GPS that are provided on the first signal process unit 140.

Figure 18:
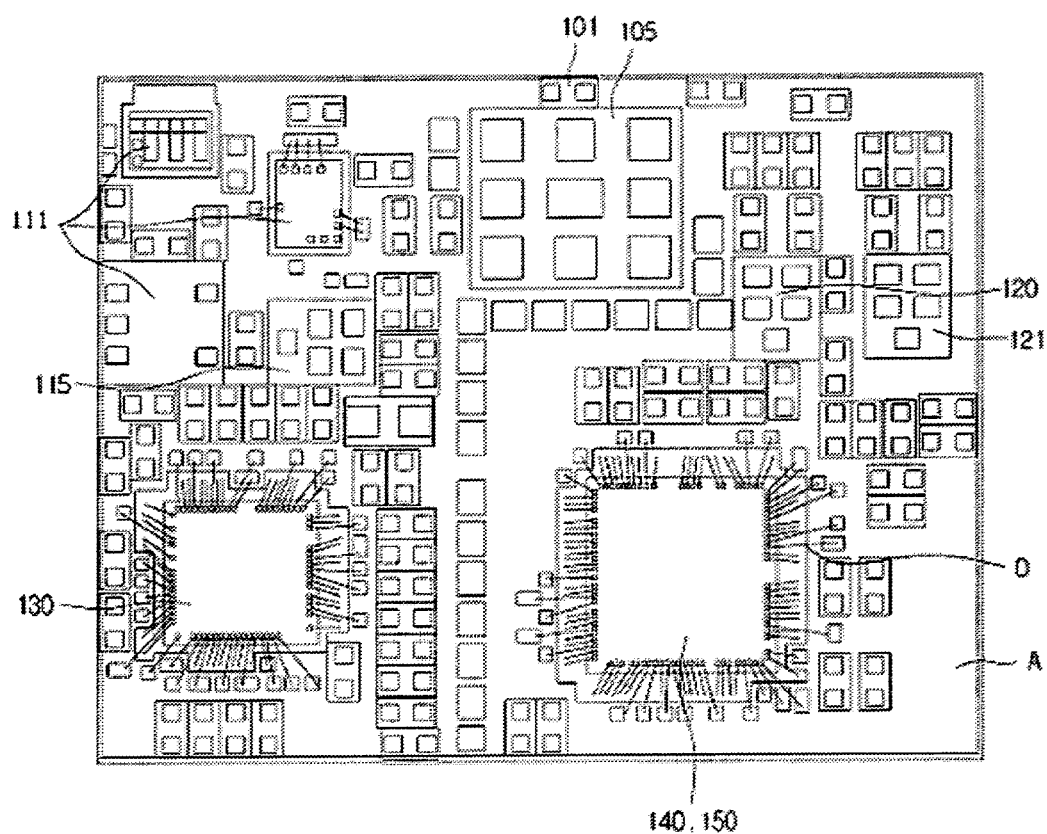
FIG. 18 is a top view of an example where components of the FEM of the third embodiment of the present invention are mounted in the form of MCM on the substrate.

FIG. 18 is a top view of an example where components of the FEM of the third embodiment of the present invention are mounted in the form of MCM on the substrate.

Referring to FIG. 18, there is shown a state where the components of the FEM 190 of the third embodiment of the present invention are mounted on a substrate A. On a right-lower end of the substrate A, the first receiving process unit 140 and the second receiving process unit 150 are die-stacked vertically and wire-bonded with the bonding pad on the substrate.

On the left-lower end of the substrate A, the transmitting process unit 130 is mounted and the transmitting filter 115 is arranged on the upper portion of the transmitting process unit 130.

The PAM 111 is mounted on the left-upper end of the substrate A. Two of three mounting structures are a load switch and a gain control switch that are provided on the PAM 111.

The first and second receiving filters 120 and 121 are mounted on the upper portion of the receiving process units 140 and 150. On the central-upper end, the duplexer 105 is mounted. An antenna 101 connected to the antenna is placed on the upper portion of the duplexer 105.

The FEM 190 of the third embodiment is a communication module having a diversity receiving function in the form of a signal MCM. A FEM having a diversity receiving function in the formed of a dual MCM will now be described.

Figure 19:
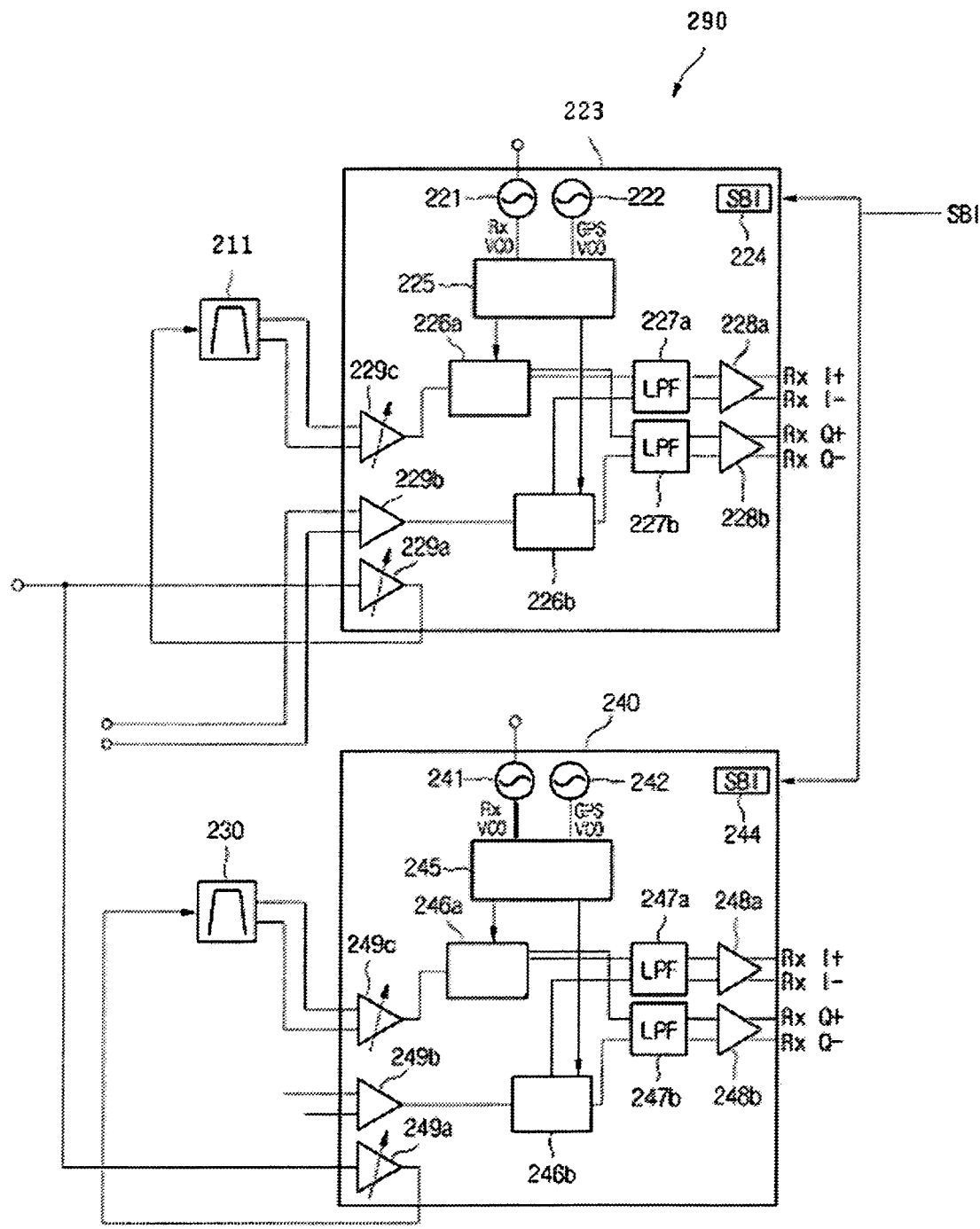
FIG. 19 is a block diagram of a modified example of the components of the FEM 290 of the third embodiment.

FIG. 19 is a block diagram of a modified example of the components of the FEM 290 of the third embodiment.

Referring to FIG. 19, an FEM of a modified example of the third embodiment include a first receiving filter 211, a second receiving filter 230, a first receiving process unit 223, and a second receiving process unit 240. The first and second process units 223 and 240 are identically structured. That is, the first and second process units 223 and 240 include Rx VCOs 221 and 241, GPS VCOs 222 and 242, oscillating signal dividers 225 and 245, SBIs 224 and 244, mixers 226a and 246a for the receiving signal, mixers 226b and 246b for the GPS, LPFs 227a and 247a for the receiving signal, LPFs 227b and 247b for the GPS, power amplifiers 228a and 248a for the receiving signal, power amplifiers 228b and 248b for the GPS, LNAs 229a and 249a for the receiving signal, filter amplifiers 229C and 249c, and initial amplifiers 229b and 249b for the GPS.

The identical components of the receiving process unit 240 of this modified example to those of the receiving process unit 240 of FIG. 17 will not be described.

The FEM 290 of the modified example of the third embodiment does not include the duplexer, the transmitting process unit, the PAM, and the transmitting filter but includes dual receiving process units 220, 240 provided in the form of MCM having the diversity receiving function.

Figure 20:
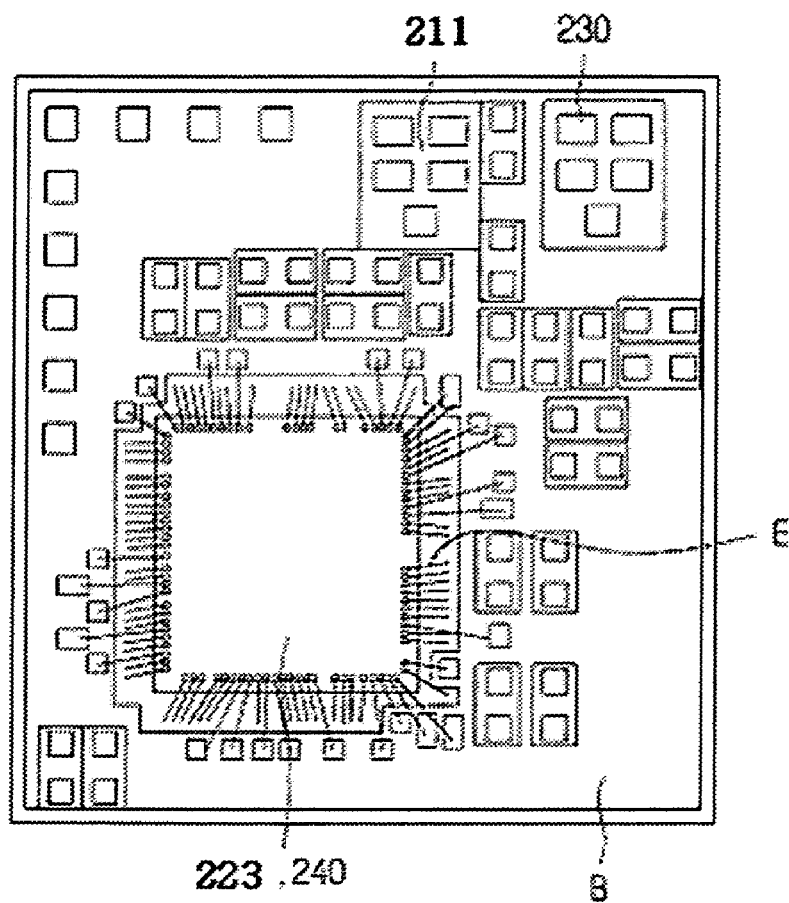
FIG. 20 is a top view of an example where components of the FEM of the modified example of the third embodiment of the present invention are mounted in the form of MCM on the substrate.

FIG. 20 is a top view of an example where components of the FEM of the modified example of the third embodiment of the present invention are mounted in the form of MCM on the substrate.

Referring to FIG. 20, the first and second receiving process units 223 and 240 are die-stacked vertically on the substrate and wire-boned to the bonding pad.

The first and second receiving filters 211 and 230 are mounted on the receiving process units 220,240.

Figure 21:
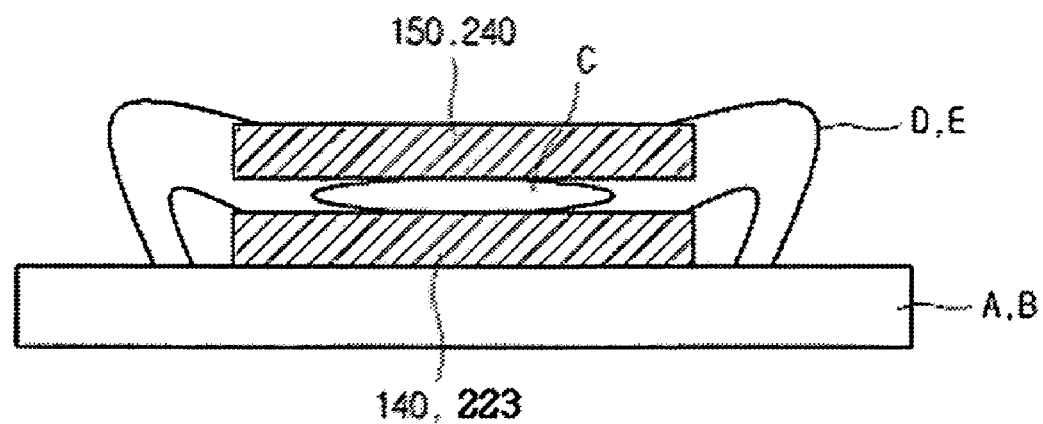
FIG. 21 is a side view of an example where first and second receiving process units of the FEM according to the third embodiment of the present invention are die-stacked.

FIG. 21 is a side view illustrating the die-stacking of the first receiving process units 140 and 223 and the second receiving process units 150 and 240 of the third embodiment and the modified example of the third embodiment.

Referring to FIG. 21, there is shown a die-stacking state where the first and second receiving process units 140 and 223 and 150 and 240 are die-stacked vertically and wire-bonded to the bonding pad.

Chips of the first receiving process units 140 and 223 are mounted on the mounting region of the substrate and chips of the second receiving process units 150 and 240 are stacked on the chips of the first receiving process units 140 and 223. The stacked chips are wire-bonded to the pads formed on the substrate.

When the first receiving process units 140 and 223 are mounted on the substrate or the second receiving process units 150 and 240 are mounted on the first receiving process units 140 and 220 through an epoxy process using an adhesive such as insulation epoxy resin, a thermal-bonding process, or a taping process.

After the first receiving units 140 and 223 and the second receiving units 150 and 240 are die-stacked, the wire-bonding process may be simultaneously performed. However, if required, after the first receiving process units 140 and 223 are mounted on the substrate and wire-bonded, the second receiving process units 150 and 240 may be mounted and wire-bonded.

When the first and second receiving process units are die-stacked and wire-bonded, it is preferable that they are molded on the substrate through an EMC molding process.

In the FEM of the third embodiment, when the FEM is manufactured to provide the diversity function to the RF receiving unit processing the communication using the CDMA 1x EV-DO standard and the receiving unit chips are stacked without using an additional diversity chip, the mounting area can be remarkably reduced and thus the size of the FEM can be minimized in the form of a signal or dual MCM.

In addition, when the FEM for the CDMA 1xEV-DO having the diversity function is manufactured, no diversity chip is required and thus the substrate area can be reduced without being affected by the barrier structure. Therefore, the design flexibility for the arrangement of other devices can be obtained and thus the size and cost of the communication device can be reduced.

Fourth Embodiment

The FEM of a fourth embodiment of the present invention is identical to that of FIG. 5.

Figure 22:
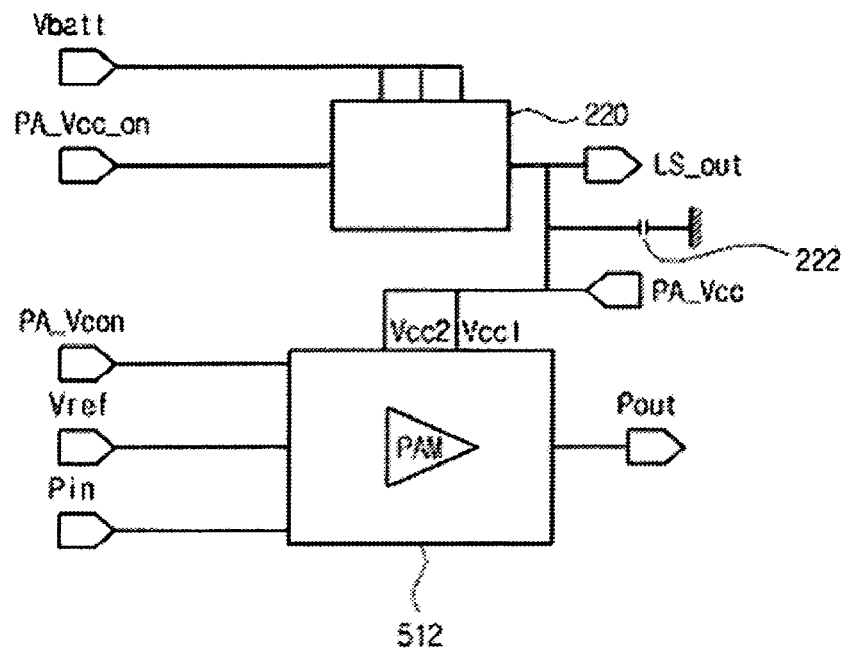
FIG. 22 is a circuit block diagram illustrating a connecting when a load switch is provided on the CDMA FEM according to a fourth embodiment of the present invention.

FIG. 22 is a schematic circuit block diagram of a connection when a load switch 220 is provided on the CDMA FEM according to a fourth embodiment of the present invention.

Referring to FIG. 22, the load switch 220 includes a "Vbatt" terminal, a "PA_Vcc_on" terminal, and an "LS_out" terminal. A PAM 512 includes a "PA_Vcc" terminal, a "PA_Vcon" terminal, a "Vref" terminal, a "P_in" terminal, and "P_out" terminal.

The load switch 220 is connected to a power source (a battery circuit) through the "Vbatt" terminal.

The load switch 220 is connected to a base band process unit 600 through the "PA_Vcc_on" terminal to receive a control signal therefrom and determines if the control signal is a high or low mode.

When the control signal is in the high mode, the load switch 220 supplies power to the PAM 512. When the control signal is in the low mode, the load switch 220 does not supply power to the PAM 512.

The load switch 220 outputs power supplied from the power source through the "LS_out" terminal.

The load switch 220 may be formed in an individual switch device or a switch circuit having a resistor, switching transistor, a capacitor, and a diode.

The PAM 512 includes an input matching circuit, a driver amplifier (DA), an intermediate matching circuit, a power amplifier, an output matching circuit, and a bias circuit.

The "PA_Vcc" terminal is connected to the PAM 512 through two lines and transmits first and second powers Vcc1 and Vcc2 through the lines.

At this point, powers from 3.2v to 4.2V are respectively supplied to the first and second powers.

In addition, the PAM 512 is connected to a transmitting BPF 514 through the "P_in" terminal and amplifies an RF signal inputted through the "P_in" terminal.

The PAM 512 is connected to the duplexer 300 through the "P_out" terminal and outputs the RF signal to the duplexer 300 through the "P_out" terminal.

The "PA_Vcon" terminal is connected to a bias circuit in the PAM 512 to transmit a high or low state voltage to the PAM 512, thereby controlling the base terminal current of the amplifier transistor provide on the PAM 512.

The ""V_ref" terminal is also connected to the bias circuit in the PAM 512 to transmit a current from an active region to the base terminal of the amplifier transistor provided on the PAM 512.

On the connection portion of the "LS_out" terminal and the "PA_Vcc" terminal, a passive device unit 222 is provided to stabilize the power voltage transmitted from the "LS_out" terminal to the "PA_Vcc" terminal. The passive device unit 222 may be a capacitor (condenser).

For example, the capacitor may be a multiplayer ceramic capacitor (MLCC) or a tantal capacitor. The capacitor has a capacitance within a range of 4.5-10 µF.

The MLCC is a substrate mounting type charge storage device that can be ultra-small-sized but can store a large amount of electric charges.

In addition, the MLCC is good in a high frequency property and stable against the environmental variation such as a temperature, thereby stably providing a rated voltage.

The tantal capacitor is manufactured through a process for making a $Ta_2O_5$ structure by sintering a tantal layer on a positive pin and forming a positive oxide layer on the sintered tantal layer and a process for depositing and heat-treating manganese nitrate on the $Ta_2O_5$ surface to form electrolyte.

The electrolyte functions as the capacitor by charging electric charges. When silver is plated on an outer layer of the manganese nitrate and a negative pin is attached to function as the high capacitor.

The passive device unit 222 formed of the small-sized high capacity MLCC or tantal capacitor stores an excess voltage by the generation of the variable voltage or an excess voltage by the input of the noise components and provides a uniform voltage, thereby suppressing the variable voltage and noise components.

Figure 23:
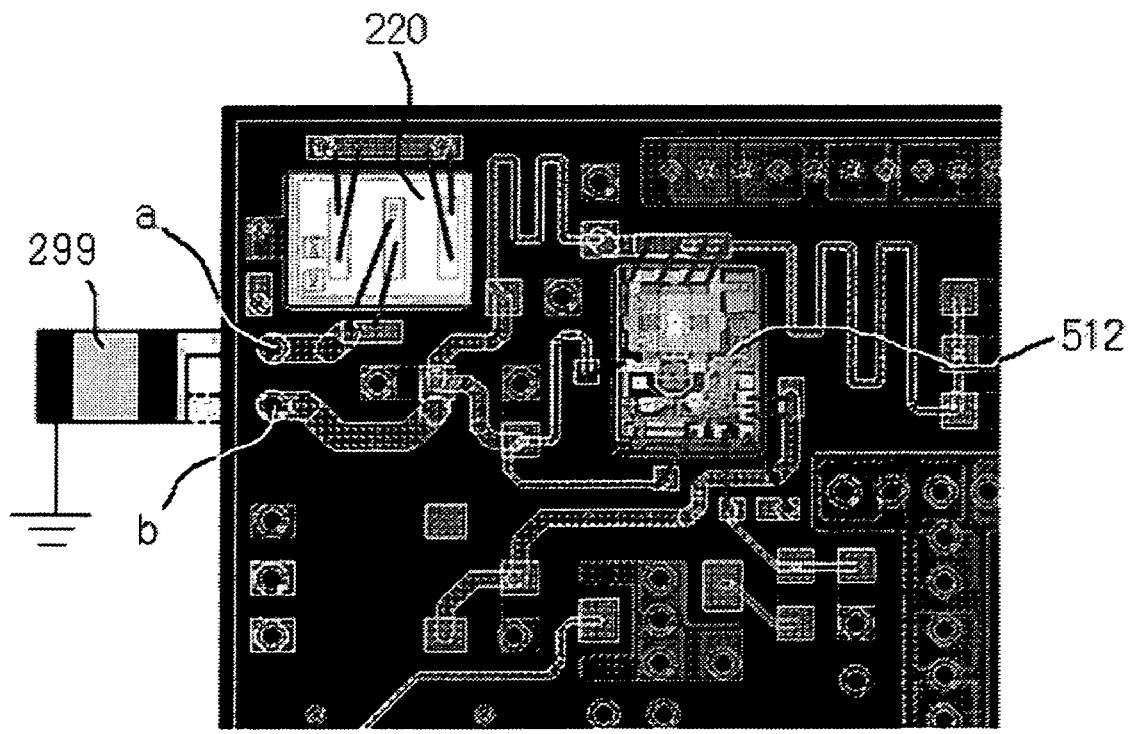
FIG. 23 is a top view of a part of a top layer of a substrate on which the CDMA FEM of the fourth embodiment is mounted.
Figure 24:
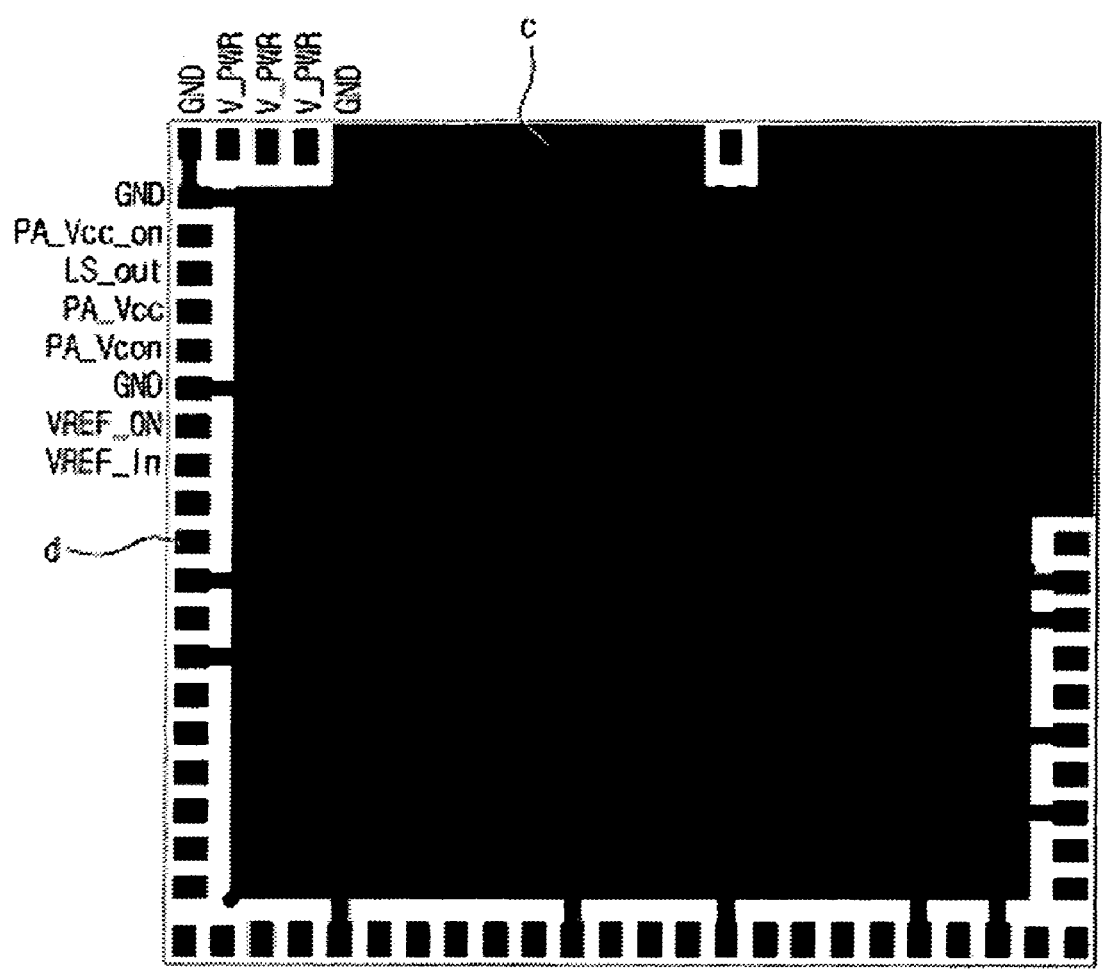
FIG. 24 is a top view of a part of a bottom layer of a substrate on which the CDMA FEM of the fourth embodiment is mounted.

FIG. 23 is a top view of a part of a top layer of a substrate on which the CDMA FEM of the fourth embodiment is mounted and FIG. 24 is a top view of a part of a bottom layer of a substrate on which the CDMA FEM of the fourth embodiment is mounted.

Referring to FIG. 23, there is shown the "LS_out" terminal (a) and the "PA_Vcc" terminal (b) formed on the top layer of the substrate. The load switch 220 is die-bonded on a left-upper end of the substrate and the PAM 512 is die-bonded on the central portion.

The PAM 512 is electrically connected to the "PA_Vcc" terminal (b) through a transmitting pattern and the load switch is electrically connected to the "LS_out" terminal (a) through a transmitting pattern.

The "LS_out" terminal (a) and the "PA_Vcc" terminal (b) are connected to each other by the capacitor 222.

Referring to FIG. 24, the bottom layer of the substrate is a ground layer and a die bonding pattern C is formed on most of the central region and a terminal pattern (d) is formed around the ground pattern (C).

The substrate is a multi-layered structure and the terminal patterns (d) are connected to devices on the top layer and the interlayer. As shown in FIG. 24, the "PA_Vcc_on" terminal, "LS_out" terminal, "PA_Vcc" terminal, "PA_Vcon" terminal, "Vref" terminal are formed in this order.

In the FEM of the fourth embodiment, even when a relatively high intensity of signal is applied through the "Vbatt" terminal, the PAM is not damaged. In addition, since the noise components inputted together with the power can be suppressed, the function of the duplexer can be stably maintained.

Furthermore, when there is a power surge, this can be suppressed to prevent the malfunction of the PAM and damage of the internal circuits, thereby improving the reliability of the communication system.

Fifth Embodiment

Figure 25:
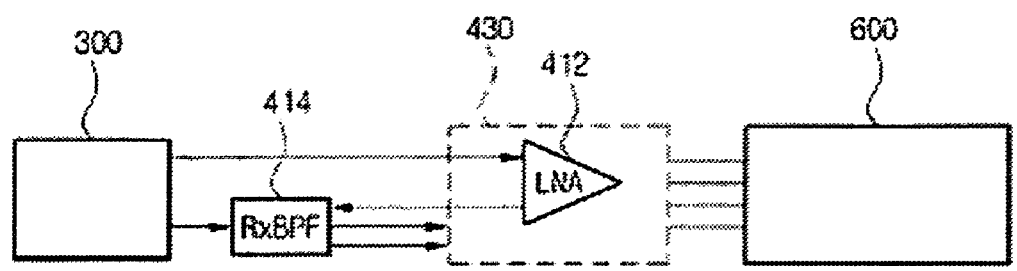
FIG. 25 is a circuit block diagram of an FEM according to a fifth embodiment of the present invention.

FIG. 25 is an FEM according to a fifth embodiment of the present invention. In this embodiment, a LNA 412 is provided in a receiving process unit 430 formed in a signal chip.

As the LNA 412 is provided in the receiving process unit 430, the output terminal of a duplexer 300 is connected to the receiving process unit 430 and electrically connected to the LNA 412. The output terminal of the LNA 412 leads out to an external side of the receiving process unit 430 and is connected to a receiving BPF 414.

The output terminal of the receiving BPF 414 is further connected to the receiving process unit 430 and transmits the digital signal processed by the receiving process unit 430 to the base band process unit 600.

Accordingly, a chip of the receiving process unit 430 is connected to the output terminal of the duplexer 300, the input and output terminals of the receiving BPF 414, and the base band process unit 600.

By the above structure, the flexibility for arranging the duplexer 300, the receiving process unit 430, the receiving BPF 414 on the substrate can be improved.

Figure 26:
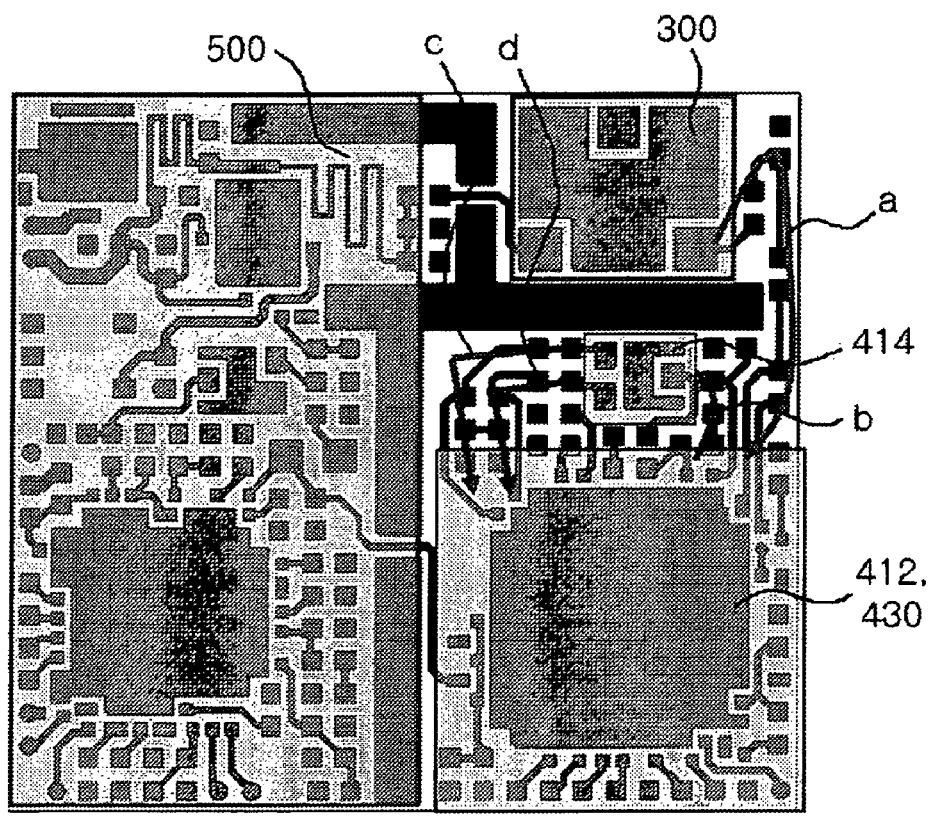
FIG. 26 is a top view of a mounting structure of the FEM of the fifth embodiment.

FIG. 26 is a top view of a mounting structure of the FEM of the fifth embodiment.

Referring to FIG. 26, a transmitter 500 is mounted on a left region of the substrate on which the FEM is mounted and the duplexer 300 is mounted on a right-upper of the substrate.

The receiving BPF 414 is mounted below the duplexer 300 and the receiving process unit 430 with the LNA 412 is mounted below the receiving BPF 414.

The receiving BPF 414 and the receiving process unit 430 are separated from the transmitter 500 and the duplexer 300 by a barrier structure.

The duplexer 300 is connected to the receiving process unit 430 through a transmitting pattern (a) formed along a right end of the substrate and the receiving BPF 414 has an input terminal connected to the receiving process unit 430 through a transmitting pattern formed on the right side.

In addition, the output terminal of the receiving BPF 414 is connected to the receiving process unit 430 through wire line patterns (c and d) formed on the right side.

The wire line patterns (a, b, c, and d) can be formed on the wire pattern layer of the multi-layered substrate.

By the above-described structure, since lengths of the wire line patterns can be almost same as each other and the output terminal of the receiving BPF 414 can be positioned near the receiving process unit 430, the signal loss can be minimized.

Figure 27:
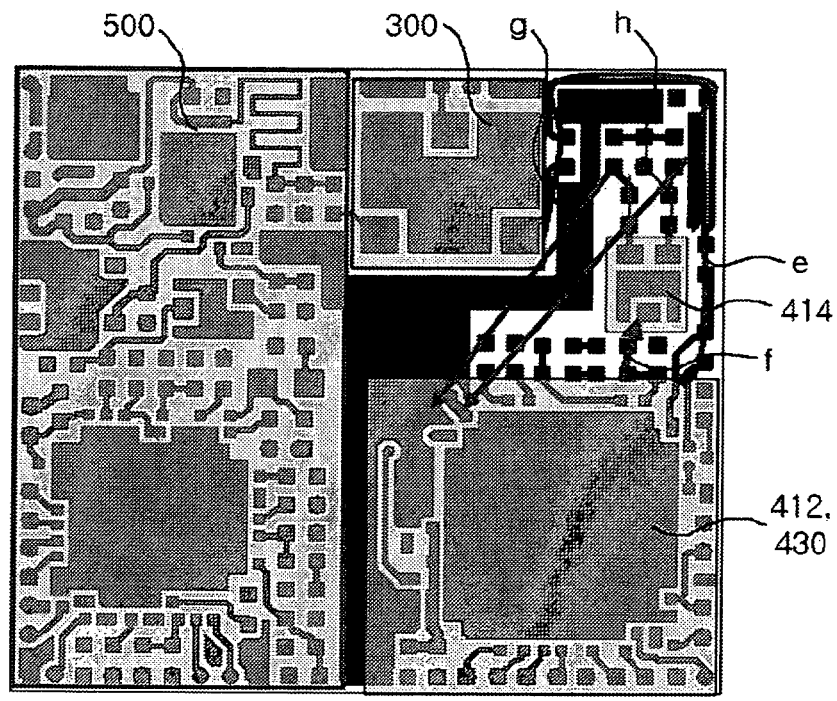
FIG. 27 is a top view of a modified example of a mounting structure of the FEM of the fifth embodiment.

FIG. 27 is a top view of a modified example of the mounting structure of the FEM of the fifth embodiment.

Referring to FIG. 27, the transmitter 500 is mounted on a left region of the substrate and the duplexer 300 is mounted on a right-upper end of the substrate. Unlike the embodiment of FIG. 26, the duplexer 300 is sided to the left at the upper end.

The wire line pattern is formed on a right side of the duplexer 300 and the receiving BPF 414 is mounted in parallel with the duplexer 300.

The receiving process unit 430 with the LNA 412 is mounted below the duplexer 300 and the receiving BPF 414. The receiving BPF 414 and the receiving process unit 430 are separated from the transmitter 500 and the duplexer 300.

Referring to FIG. 27, in order to arrange the duplexer 300 and the receiving BPF 414 in parallel with each other, the barrier structure is different from that of the fifth embodiment.

The duplexer 300 is connected to the receiving process unit 430 through a transmitting pattern (e) formed along a right end side of the substrate and the wire line pattern (e) extends around the barrier structure and the receiving BPF 414.

The receiving BPF 414 has an input terminal oriented downward and an output terminal oriented upward. Therefore, the input terminal close to the receiving process unit 430 is electrically conducted through a short wire line pattern (f) and the output terminal far from the receiving process unit 430 is electrically conducted through relatively long wire line patterns (g, h).

The wire line patterns (e, f, g, and h) used for the above connection can be arranged on the wire pattern layer of the multilayered substrate.

In the above structure, the receiving BPF 414 can be disposed as possible as far from the transmitter 500 and protected by the barrier structure and the ground pattern, the electric wave coupling affection can be minimized.

As describe above, according to the arrangement of the FEM of the present invention, the IMD (Intermodulation Distortion), the receiving sensitivity, the single tone distortion (STD) property can be improved.

According to the FEM of the fifth embodiment, since the design flexibility in the arrangement of the receiving filter is improved and thus the receiving filter can be disposed at a variety of locations.

Furthermore, by varying the arrangement design of the receiving filter, the receiving sensitivity, the IMD property, the STD property can be improved and the communication system stably maintaining the receiving function can be realized.

Sixth Embodiment

Figure 28:
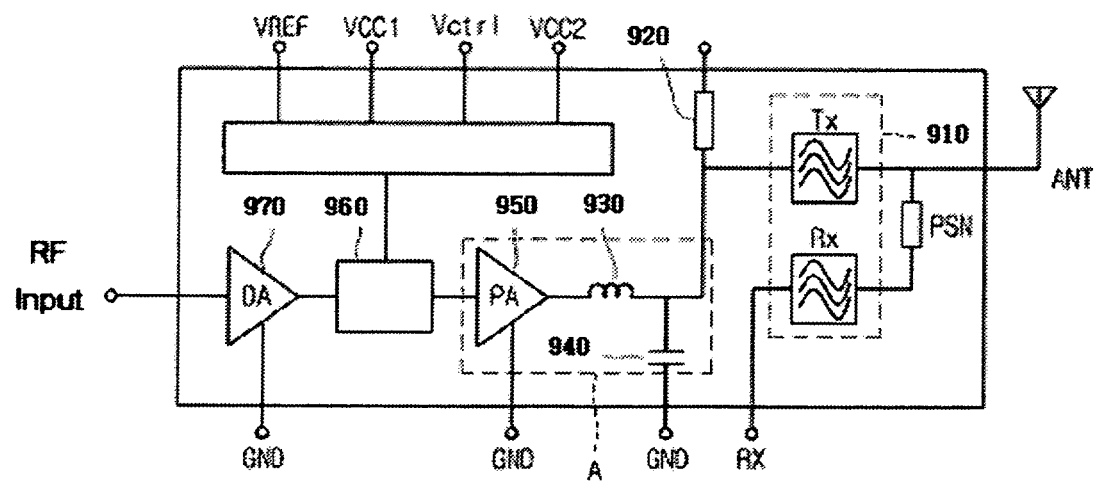
FIG. 28 is a block diagram of an FEM according to a sixth embodiment of the present invention.

FIG. 28 is a block diagram of an FEM according to a sixth embodiment of the present invention.

Referring to FIG. 28, an FEM of this embodiment includes a drive amplifier (DA) 970 amplifying the signal transmitted through an RF input terminal, a matching circuit unit 960 for performing the impedance matching for the signal amplified by the DA, a high power amplifier 950 for amplifying the matched signal, an inductor 930 and capacitor 940 coupled to the output terminal of the high power amplifier (PA) 950 for the impedance matching, and a SAW duplexer 910 for filtering a transmitting signal TX for transmitting the signal amplified by the PA 950 to the antenna and a receiving signal RX received from the antennal through a transmitting pattern PSN. The conventional FEM requires an impedance matching circuit unit for the output matching of the PA 950 and a matching circuit unit for the impedance matching between the duplexer 910 and the high power amplifier module (A). However, in the FEM of this embodiment, the simple matching circuit circuits (inductor 930 and capacitor 940) are provided between the PA 950 and the duplexer 910, thereby reducing the size of the FED.

Since The inductor 930 and the capacitor 940 having predetermined reactance (XL,XC) is performed to become an optimum impedance of about 7-10Ω of between the PA 950 and the duplexer 910, the PA 950 and the duplexer 910 can be realized.

Here, a load tuning unit 920 may be provided between the inductor 930, the capacitor 940 and the duplexer 910 to vary the impedance for the duplexer 910.

The load tuning unit 920 minimizes the RF performance deterioration when the matching for the duplexer 910 is required and allows the impedance tuning to be possible at an external side.

The load tuning unit 920 functions as a RF stub by forming a high impedance line and opening a longitudinal end. When the performance of the FEM is optimum, the load tuning unit 920 is opened so that the RF performance is not varied. In addition, since the longitudinal end impedance varies according to the variation of the environment, the performance is deteriorated. Therefore, as shown in FIG. 28, the load tuning unit 920 is provided on a connection line between the duplexer 910 and the PA 950 to realize the impedance matching circuit maintaining the optimum impedance of about 7-10Ω.

Accordingly, since a plurality of matching circuit that has been provided between the PA and the duplexer in the prior art are not necessary, the size of the device can be reduced and the impedance of the duplexer can be lowered to maintain its inherent performance.

According to this embodiment, since the impedance variation of the duplexer is lowered and many matching circuit are not required, the size of the FEM can be reduced.

Seventh Embodiment

Figure 29:
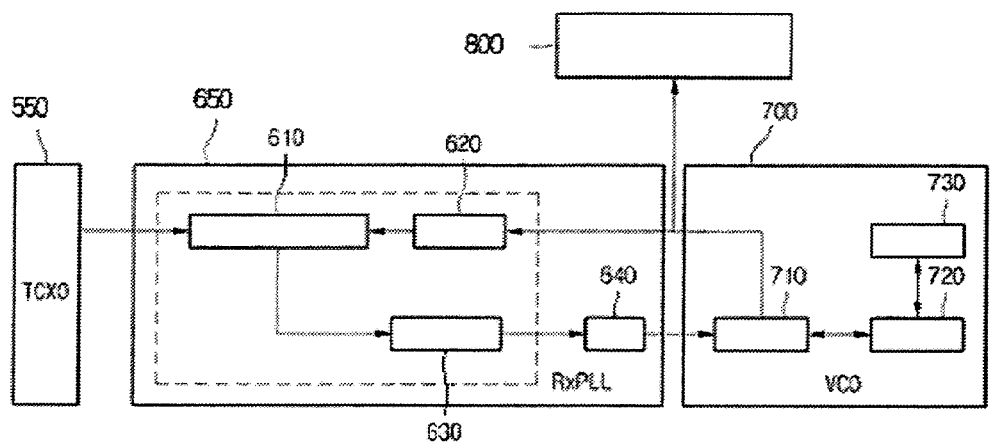
FIG. 29 is a block diagram illustrating a connection between a temperature compensated crystal oscillator (TCXO) circuit, a phase locked loop (Rx PLL) and a voltage control oscillating circuit according to a seventh embodiment of the present invention.

FIG. 29 is a block diagram illustrating a connection between a temperature compensated crystal oscillator (TCXO) part 550, a phase locked loop (Rx PLL) part 650 and a voltage control oscillating part 700.

Referring to FIG. 29, the voltage control oscillating part 700 is a circuit for providing a reference frequency signal to a base band unit 800 of a mobile communication device. The voltage control oscillating part 700 includes an oscillator 710, a filter 720, and a power supply 730.

The reference frequency signal transmitted from the voltage control oscillating part 700 is used for the intermediate frequency synthesis at the base band unit 800. Therefore, the voltage control oscillating part 700 has to stably transmit the signal.

However, the reference frequency signal may be unstable due to the outer environmental factors or the noise components generated during the supply of the power from the power supply 730. In this case, the intermediate frequency signal that is processed in the base band unit 800 may be distorted.

Therefore, in order to stably transmit the signal, the outer environmental factors and the noise components of the power supply 730 must be improved.

In order to stably transmit the reference frequency signal of the voltage control oscillating part 700 by removing the outer environmental factors such as the temperature, the TCXO part 550 and the phase locked loop part 650 are provided. The phase locked loop part 650 detects the reference frequency signal transmitted from the voltage control oscillating part 700 to the base band unit 800, compares the detected signal with the oscillating frequency signal from the TCXO part 550, generates and outputs a control signal corresponding to the frequency difference to the voltage control oscillating part 700.

Therefore, when the reference frequency signal is unstable, the phase locked loop part 650 detects this and generates and outputs the control signal to the voltage control oscillating part 700. Therefore, the voltage control oscillating part 700 can maintain the stable output of the reference frequency.

The TCXO part 550 is a device for controlling the frequency turbulence by the temperature variation in the crystal oscillator. That is, the TCXO part 550 provides the oscillating frequency signal having a predetermined value to the phase locked loop part 650.

The TCXO part 550 oscillates the fixed frequency signal that does not turbulence above 2.5 ppm even at the relatively large temperature variation (−30 to 75 °).

The locked loop part 650 includes a frequency detector 610, a divider 620, a charge pump 630, and a loop filter 640.

The frequency detector 610 receives the oscillating frequency signal from the TXCO TCXO part, detects the reference frequency signal outputted from the voltage control oscillating part 700, and compares the oscillating frequency signal with the reference frequency signal.

Generally, the reference frequency signal provided by the voltage control oscillating part 700 is the high frequency (GHz unit) and the oscillating frequency signal provided by the TCXO part 550 is the lower frequency (MHz unit) lower than the reference frequency.

Accordingly, in order to compare the reference frequency signal with the oscillating frequency signal, the reference frequency signal must be converted into the low frequency by the divider 620.

For example, when the TCXO part 550 provides the oscillating frequency signal of 100 and the voltage control oscillating part 700 provides the reference frequency signal of 1.1 Ghz, the divider 620 reduces the intensity of the reference frequency signal to $\frac{1}{10}$ so that it can be compared with the oscillating frequency signal.

The frequency detector 610 compares the oscillating frequency signal with the lowered reference frequency signal and transmits a control signal corresponding to the frequency difference to the charge pump 630. The charge pump 630 adjusts the current value according to the control signal According to the above example, the oscillating frequency signal of 100 MHz of the TCXO part 550 is compared with the lowered reference frequency signal of 110 MHz. Then, the frequency detector 610 generates a control signal corresponding to the frequency difference of 10 MHz.

The charge pump 630 is an electronic circuit that can provide or absorb a predetermined amount of electric charges according to the control signal.

That is, when the voltage of the reference frequency signal is higher compared with the oscillating frequency signal, the charge pump 630 transmits a predetermined amount of electric charges using the dividing circuit. When the voltage of the reference frequency signal is lower compared with the oscillating frequency signal, the charge pump 630 absorbs a predetermined amount of electric charges from the loop filter 640 using the dividing circuit.

The control signal whose current intensity is controlled according to the control signal is transmitted to the loop filter 640. In this case, the loop filter 640 can use a secondary low pass filter having two capacitors and one resistor.

The capacitors coupled to the resistor in parallel with each other controls the amount of the electric charges that will be repulsed or attracted by the charge pump 630 to control the voltage of the voltage control oscillating part 700 and reduce the spurious property generated by the phase locked loop part 650.

Generally, the frequency detector 610, divider 620, charge pump 630 of the receiving side phased locked loop part 650 may be arranged on the transmitting chip and the low pass filter 640 may be arranged on the receiving chip.

Next, when the voltage control oscillating part 700 is formed in the form of the FEM, a phase noise may be mixed and thus the receiving performance may be deteriorated. Therefore, there is a need to improve the phase noise of the power supply 730.

In order to improve the phase nose of the power supply 730, the filter 720 is provided between the power supply and the oscillator 710. The filter 720 removes the phase nose components using the capacitor when the power is supplied from the power supply 730 to the oscillator 710.

Accordingly, the voltage control oscillating part 700 receives the power whose phase noise is removed from the power supply 730 and supplies stably the power to the base band 800.

In the CDMA mobile communication module of the present invention, the frequency detector 610, divider 620, and charge pump 630 of the receiving side phase locked loop part 650 may be included in the CDMA mobile communication module.

However, the receiving level of the CDMA mobile communication device is within a wide range of −110 dBm~−25 dBm and the noise components of the receiving side voltage control oscillating part 700 affects a lot of the receiving performance.

A structure for improving the noise components of the voltage control oscillating part 700 will now be described.

Figure 30:
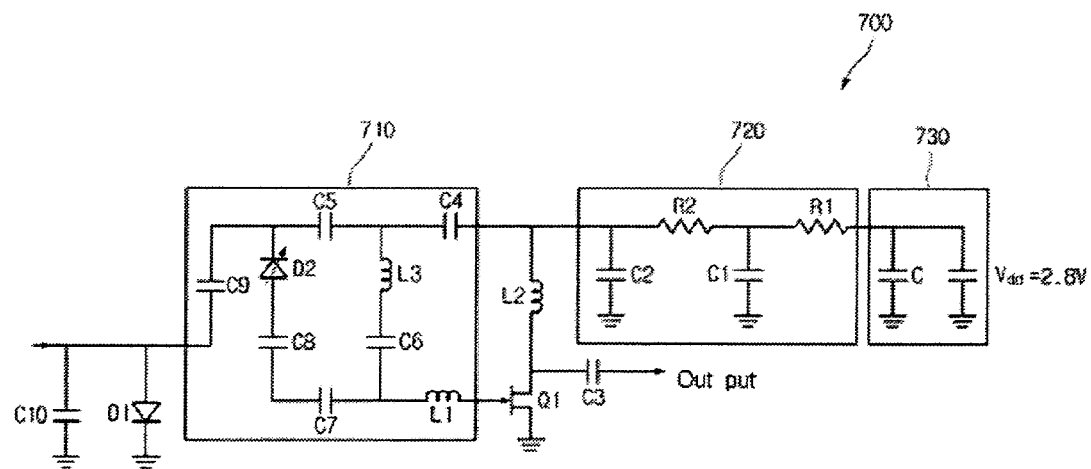
FIG. 30 is a circuit diagram of a voltage control oscillating part 700 according to a seventh embodiment of the present invention.

FIG. 30 is a circuit diagram of a voltage control oscillating part according to a seventh embodiment of the present invention.

Referring to FIG. 30, a voltage control oscillating part 700 includes a power supply 730 for supplying power, an oscillator 710 for generating a reference frequency signal by receiving the power from the power supply 730 and transmits the reference frequency signal to a base band unit of the CDMA mobile communication module, and a filter 720 connected between the power supply 730 and the oscillator 710 and filtering the phase noise of the power.

The power supply 730 is connected to a DC power supply of the mobile communication device to supply energy to the voltage control oscillating part 700. The power supply 730 has a bypass capacitor coupled to the DC power terminal in parallel to remove the noise components of the power.

The filter 720 has at least one filter part having a resistor and a capacitor that are connected in parallel. The filter 720 improves the phase noise of the power supplied from the power supply 730.

For example, the filter 720 includes a first filter part having a first resistor and a first capacitor that are connected in parallel and a second filter part having a second resistor and a second capacitor that are connected in parallel. The first and second filter part are connected in series to filter the phase noise through two steps.

The oscillator 710 is connected to a phase locked loop part 650 that compares the oscillating frequency signal provided by the TCXO part 550 with the reference frequency signal generated by the oscillator 710 and generates a control signal according to the frequency difference. The oscillator 710 receives the control signal and generates a reference frequency signal corresponding to the control signal inputted from the phase locked loop part 650.

In addition, the oscillator 710 provides the generated reference frequency signal to the base band unit so that the reference frequency signal can be used at a frequency mixer.

The power supply 730, oscillator 710, and filter 720 of the voltage control oscillating part 700 is installed in the receiving chip of the CDMA mobile communication module and the oscillator installed in the receiving chip transmits the reference frequency signal to the receiving side base band unit.

The CDMA mobile communication module is provided in the form of the FEM. Thus the power supply 730, oscillator 710 and filter 720 are formed in the FED.

Figure 31:
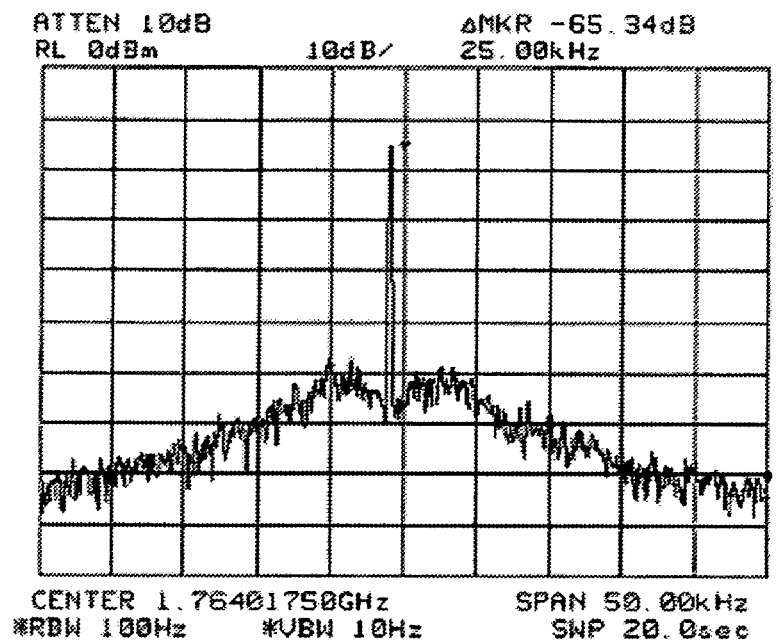
FIG. 31 is a graph illustrating a waveform of an oscillating signal processed in the oscillator according to the seventh embodiment of the present invention.
Figure 32:
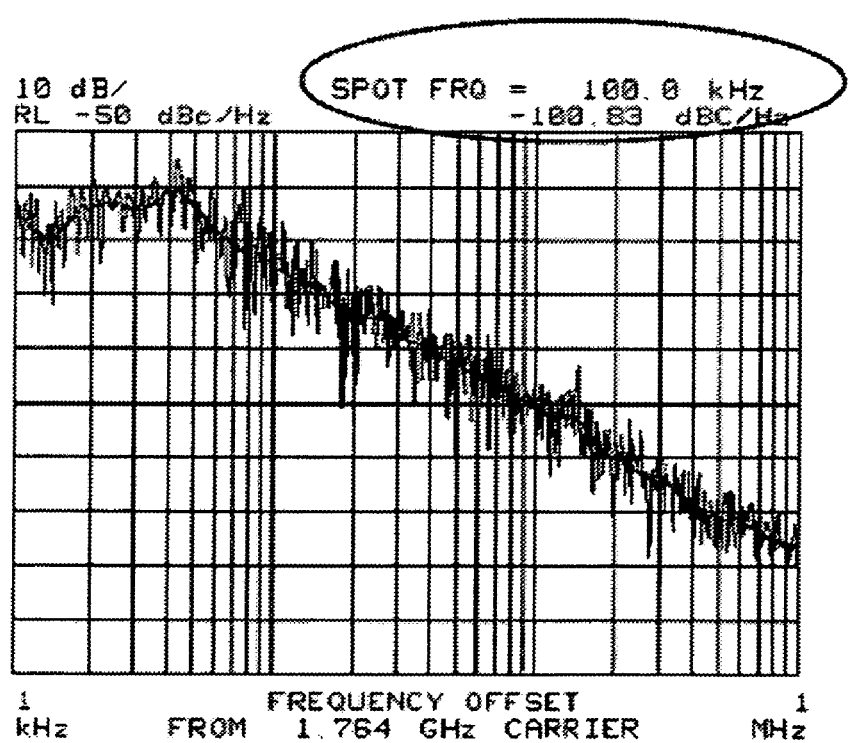
FIG. 32 is an enlarged graph of an oscillating signal processed in the oscillator of the conventional voltage control oscillating circuit.
Figure 33:
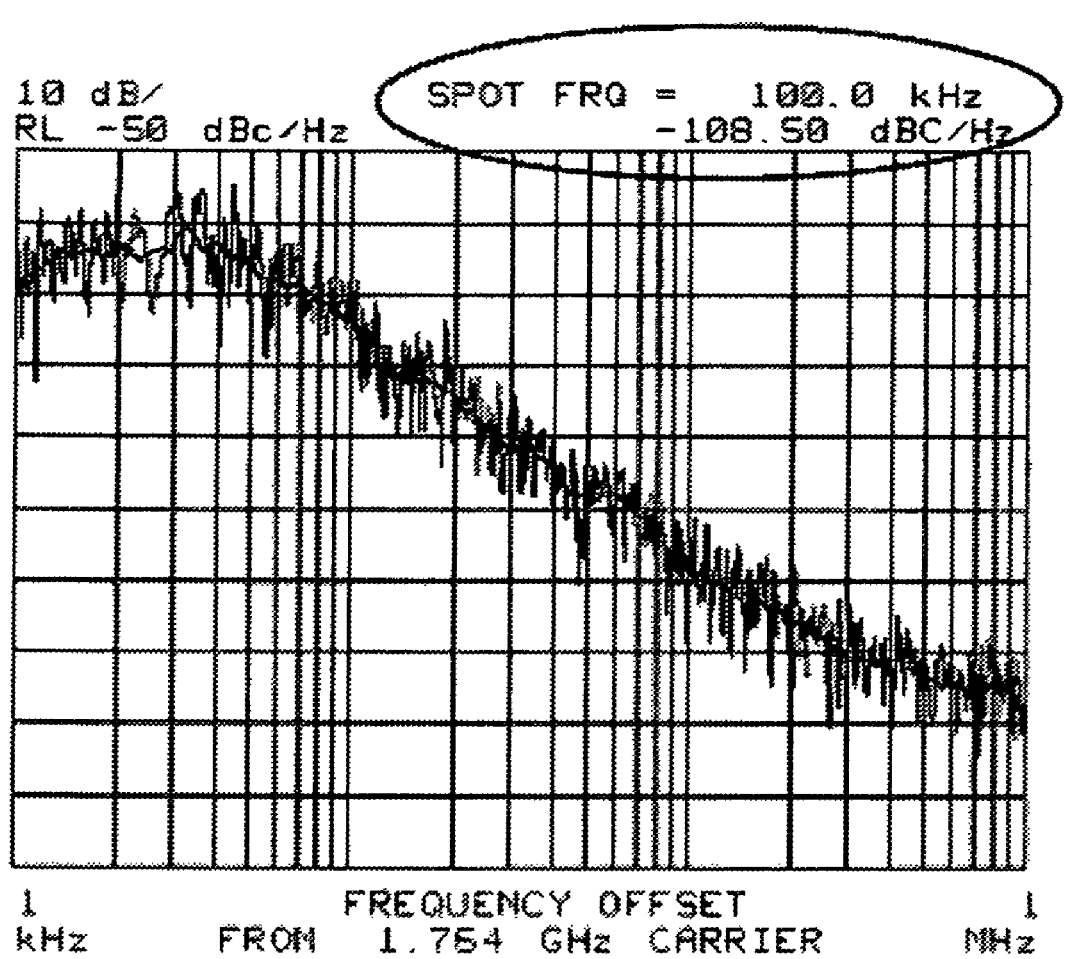
FIG. 33 is an enlarged graph of an oscillating signal processed in the oscillator of the voltage control oscillating circuit according to the seventh embodiment of the present invention.

FIG. 31 is a graph illustrating a waveform of an oscillating signal processed in the oscillator according to the seventh embodiment of the present invention and FIG. 32 is an enlarged graph of an oscillating signal processed in the oscillator of the conventional voltage control oscillating circuit. FIG. 33 is an enlarged graph of an oscillating signal processed in the oscillator of the voltage control oscillating circuit according to the seventh embodiment of the present invention.

In the graph, the horizontal axis denotes a frequency band and the vertical axis indicates power.

Referring to FIG. 31, the devices of the oscillator 710 concentrates the energy at 1.764 GHz region and generates an electric oscillating phenomenon to oscillate the reference frequency signal.

The oscillator 710 transmits the reference frequency signal to the receiving side base band unit. This can be realized by the movement of the electric charges accumulated on a capacitor C1 shown in FIG. 30.

FIGS. 32 and 33 are enlarged graphs of the reference frequency signals where the oscillation occurs. FIG. 32 shows a waveform of the output of the conventional voltage control oscillating circuit, having an inclination of −100.83 dBc/Hz.

FIG. 33 shows a waveform of the output of the voltage control oscillating part 700 according to the seventh embodiment of the present invention. An inclination of the graph is −108.50 dBc/Hz (here, when current signal intensity per 1 mW is represented as dBm, dBc is a unit representing a signal intensity difference that is represented by dBm).

The output waveform of the voltage control oscillating part of the present invention shows a result when the phase noise is secondarily filtered. The output waveform is improved by 8-9 dBC/Hz at the frequency of 100 KHz offset as compared with the convention output waveform.

According to the voltage control oscillating part of the FEM according to the seventh embodiment of the present invention, by removing the phase noise of the power supply of the voltage oscillating circuit, the spurious property, STD property, IMD property of the mobile transmitting/receiving system can be improved and thus the power can be stably supplied to the receiving unit without being affected by the external power.

In addition, the voltage control oscillating circuit of the FEM is included in the receiving unit of the mobile transmitting/receiving system realized by the FEM to stably provide the reference frequency signal and minimize the size of the FEM product.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A front end module having a multilayered structure comprising a transmitter, a receiver and a duplex unit,
    wherein the multilayered structure comprises a ground layer including plural ground patterns having at least one block on a surface of a substrate of the front end module, and
    the multilayered structure further comprises:
    a device mounting layer which has a plurality of pattern regions comprising bonding patterns on which the transmitter, receiver and duplex unit are mounted, the device mounting layer having a ground pattern of the device mounting layer separated from the plurality of pattern regions;
    an upper ground layer provided with a plurality of via-holes and a ground pattern of the upper ground layer separated from the plurality of via-holes, wherein the upper ground layer comprises a first pattern open region in a line shape corresponding to a boundary portion between a receiver mounting region and a duplexer mounting region; and
    a wire pattern layer provided with a transmitting pattern and a ground pattern of the wire pattern layer separated from the transmitting pattern, wherein the wire pattern layer comprises a second pattern open region in a line shape corresponding to the first pattern open region,
    wherein the ground layer is a lower ground layer having a ground pattern of the lower ground layer and a connection pattern separated from the ground pattern of the lower ground layer.

2. The front end module according to claim 1, wherein the ground pattern is comprised in a rectangular lattice structure and separated into a plurality of blocks.

3. The front end module according to claim 1, wherein the ground pattern is comprised in a rectangular lattice structure having n rows and n columns or n rows and n±1 columns.

4. The front end module according to claim 1, wherein the ground pattern has 4 blocks arranged in two rows and two columns or 72 blocks arranged in 9 rows and 8 columns.

5. A front end module having a multilayered structure comprising a transmitter, a receiver and a duplex unit,
    wherein the multilayered structure further comprises:
    a ground layer including plural ground patterns having at least one block on a surface of a substrate of the front end module,
    a device mounting layer which has a plurality of pattern regions comprising bonding patterns on which the transmitter, receiver and duplex unit are mounted, wherein among regions on which the transmitter, receiver and duplex unit are mounted, at least one region has a region on which a ground pattern of the device mounting layer is not formed;
    an upper ground layer provided with a plurality of via-holes and a ground pattern of the upper ground layer separated from the plurality of via-holes, a pattern open region corresponding to a boundary portion between the transmitter, receiver and duplex unit of the device mounting layer, wherein the upper ground layer comprises a first pattern open region in a line shape corresponding to a boundary portion between a receiver mounting region and a duplexer mounting region; and
    a wire pattern layer provided with a transmitting pattern, a ground pattern of the wire pattern layer separated from the transmitting pattern, and a pattern open region corresponding to the upper ground layer, wherein the wire pattern layer comprises a second pattern open region in a line shape corresponding to the first pattern open region,
    wherein the ground layer is a lower ground layer having a ground pattern of the lower ground layer and a connection pattern separated from the ground pattern of the lower ground layer.

6. The front end module according to claim 5, wherein the region on which the transmitter is mounted has a ground pattern separated from the plurality of pattern regions; and
    each of the regions on which the receiver and the duplex unit is mounted has not a ground pattern separated from the plurality of pattern regions.

7. The front end module according to one of claims 1 and 5, wherein the lower ground layer includes a test pattern connected to wire line patterns of mounted devices.

8. The front end module according to one of claims 1 and 5, wherein the duplex unit is connected to an antenna terminal and comprises a circuit for matching and electro-static discharge suppressing.

9. The front end module according to claims 1 and 5, wherein the front end module is a single module comprising a block of the receiver, a block of the transmitter, and a block of the duplex unit,
    wherein the substrate comprises a multilayered substrate.

10. The front end module according to claim 9, wherein the multilayered substrate includes a layer on which a test pattern is formed, the test pattern being connected to a mixer terminal or a phase locked loop circuit terminal that is included in the transmitter block or the receiver block.

11. The front end module according to claim 9, wherein the multilayered substrate includes a matching and electro-static discharge suppressing circuit formed on a connection terminal with an antenna.

12. The front end module according to claim 9, wherein the multilayered substrate comprises:
 a first layer on which the duplex unit, transmitter, and receiver are mounted and which includes a barrier for suppressing electric wave interference between the duplex unit, transmitter, and receiver;
 a second layer provided with a via-hole, a ground pattern of the second layer, and a barrier pattern corresponding to the barrier of the first layer;
 a third layer having a wire line pattern, a ground pattern of the third layer, and an electro-static suppressing circuit mounted on a region; and
 a fourth layer having at least one among a ground pattern of the fourth layer and a test pattern.

13. The front end module according to claim 9, further comprising a load switch connected to the transmitter and mounted on the multilayered substrate.

14. The front end module according to claim 9, wherein the multilayered substrate comprises:
 a first receiving process unit having a first RF receiving unit and a first Rx base band unit; and
 a second receiving process unit having a second RF receiving unit and a second Rx base band unit,
 wherein, the first and second receiving process units are provided in the form of individual devices to realize a multi chip module structure and are die-stacked in a vertical direction.

15. The front end module according to claim 14, comprising a transmitting process unit having an RF transmitting unit and a Tx base band unit and a duplex unit terminal for separating transmitting and receiving signals, wherein the transmitting process unit and duplex unit terminal are formed in individual devices to form the multi chip module structure together with the first and second receiving process units.

* * * * *